United States Patent
Sasada et al.

(10) Patent No.: US 12,426,157 B2
(45) Date of Patent: Sep. 23, 2025

(54) FILM, LAMINATE, AND METHOD OF MANUFACTURING THE SAME

(71) Applicant: FUJIFILM Corporation, Tokyo (JP)

(72) Inventors: Yasuyuki Sasada, Kanagawa (JP); Miyoko Hara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/805,521

(22) Filed: Aug. 14, 2024

(65) Prior Publication Data

US 2024/0407090 A1    Dec. 5, 2024

Related U.S. Application Data

(63) Continuation of application No. PCT/JP2023/013432, filed on Mar. 30, 2023.

(30) Foreign Application Priority Data

Mar. 31, 2022 (JP) ................. 2022-060849

(51) Int. Cl.
  *B32B 3/00* (2006.01)
  *H05K 1/03* (2006.01)

(52) U.S. Cl.
  CPC ........... *H05K 1/036* (2013.01); *B32B 3/00* (2013.01); *H05K 2201/0141* (2013.01); *H05K 2201/0145* (2013.01)

(58) Field of Classification Search
  CPC ......... B32B 2457/08; B32B 3/00; B32B 3/08; B32B 15/02; H05K 1/03; H05K 1/036; H05K 1/0353; H05K 1/0373; H05K 1/0141
  See application file for complete search history.

(56) References Cited

U.S. PATENT DOCUMENTS

| | | | |
|---|---|---|---|
| 2006/0177640 A1* | 8/2006 | Higashioji | B32B 3/12 428/216 |
| 2018/0242448 A1 | 8/2018 | Yoshikawa et al. | |
| 2023/0286250 A1* | 9/2023 | Sasada | B32B 15/20 |
| 2023/0292434 A1* | 9/2023 | Sasada | C08K 3/013 |
| 2023/0364887 A1* | 11/2023 | Sasada | C08G 63/183 |
| 2023/0383076 A1* | 11/2023 | Sasada | B32B 27/36 |

FOREIGN PATENT DOCUMENTS

| | | |
|---|---|---|
| JP | 2004050704 | 2/2004 |
| JP | 2013038094 | 2/2013 |
| JP | 2019199612 | 11/2019 |
| JP | 2022017947 | 1/2022 |
| WO | 2022113961 | 6/2022 |

OTHER PUBLICATIONS

JP 2021-133587 (Year: 2021).*
"International Search Report (Form PCT/ISA/210) of PCT/JP2023/013432," mailed on May 30, 2023, with English translation thereof, pp. 1-5.
"Written Opinion of the International Searching Authority (Form PCT/ISA/237) of PCT/JP2023/013432," mailed on May 30, 2023, with English translation thereof, pp. 1-6.

* cited by examiner

*Primary Examiner* — Elizabeth E Mulvaney
(74) *Attorney, Agent, or Firm* — JCIPRNET

(57) ABSTRACT

A film includes a layer A, and a layer B provided on at least one surface of the layer A, in which a ratio of an elastic modulus of the layer A at 160° C. to an elastic modulus of the layer B at 160° C. is 1.2 or more, and a thermal conductivity of the layer A is 0.05 W/(m·K) or more. A laminate includes a layer A, a layer B, and a metal layer or a metal wire, in this order, in which a ratio of an elastic modulus of the layer A at 160° C. to an elastic modulus of the layer B at 160° C. is 1.2 or more, and a thermal conductivity of the layer A is 0.05 W/(m·K) or more.

13 Claims, No Drawings

FILM, LAMINATE, AND METHOD OF MANUFACTURING THE SAME

CROSS-REFERENCE TO RELATED APPLICATIONS

This application is a continuation application of International Application No. PCT/JP2023/013432, filed Mar. 30, 2023, the disclosure of which is incorporated herein by reference in its entirety. Further, this application claims priority from Japanese Patent Application No. 2022-060849, filed Mar. 31, 2022, the disclosure of which is incorporated herein by reference in its entirety.

BACKGROUND OF THE INVENTION

1. Field of the Invention

The present disclosure relates to a film, a laminate, and a method of manufacturing the same.

2. Description of the Related Art

In recent years, frequencies used in a communication equipment tend to be extremely high. In order to suppress transmission loss in a high frequency band, insulating materials used in a circuit board are required to have a lowered relative permittivity and a lowered dielectric loss tangent.

In the related art, polyimide is commonly used as the insulating material used in the circuit board, a liquid crystal polymer which has high heat resistance and low water absorption and is small in loss in the high frequency band has been attracted.

As a resin composition for forming a film in the related art, for example, JP2019-199612A discloses a resin composition including a styrene-based polymer, an inorganic filler, and a curing agent. The resin composition is described as satisfying Expressions (A) and (B) in a form of a film having a thickness of 25 μm, in which the styrene-based polymer is an acid-modified styrene-based polymer having a carboxyl group, the inorganic filler is silica and/or aluminum hydroxide, the particle diameter of the inorganic filler is 1 μm or less, the content of the inorganic filler is 20 to 80 parts by mass with respect to 100 parts by mass of the styrene-based polymer.

$$X \leq 50 \quad (A)$$

$$Y \geq 40 \quad (B)$$

(In the expression, X represents an absorbance (unit: %) of light having a wavelength of 355 nm, and Y represents a haze value (unit: %).)

In addition, as a thermosetting adhesive sheet in the related art, a thermosetting adhesive sheet described in JP2022-17947A is known.

JP2022-17947A discloses a thermosetting adhesive sheet including a binder resin and a curing agent, in which a cured substance obtained by heating the thermosetting adhesive sheet at 180° C. for 1 hour satisfies (i) to (iv).

(i) In a case where the thickness of the cured product is 25 μm, the energy ray transmittance at a wavelength of 355 nm is 0% to 40%.
(ii) The relative permittivity is 1.5 to 3.0 at a frequency of 10 GHz and 23° C.
(iii) The dielectric loss tangent is 0.0001 to 0.01 at a frequency of 10 GHz and 23° C.
(iv) The linear expansion coefficient al at 0° C. to the glass transition temperature is 100 to 500 ppm/° C.

SUMMARY OF THE INVENTION

An object to be achieved by the embodiments of the present disclosure is to provide a film having excellent level difference followability and laser processing suitability.

In addition, an object to be achieved by another embodiment of the present disclosure is to provide a laminate and a method of manufacturing the same, which have excellent level difference followability and laser processing suitability.

The methods for achieving the above-described objects include the following aspects.

<1> A film including: a layer A; and a layer B provided on at least one surface of the layer A, in which a ratio of an elastic modulus of the layer A at 160° C. to an elastic modulus of the layer B at 160° C. is 1.2 or more, and a thermal conductivity of the layer A is 0.05 W/(m·K) or more.

<2> The film according to <1>, in which an elastic modulus of the layer A at 160° C. is 100 MPa to 2,500 MPa.

<3> The film according to <1> or <2>, in which a dielectric loss tangent of the layer A is 0.01 or less.

<4> The film according to any one of <1> to <3>, in which the layer A contains a liquid crystal polymer.

<5> The film according to any one of <1> to <4>, in which the layer A contains aromatic polyester amide.

<6> The film according to any one of <1> to <5>, in which the layer A contains a filler having a thermal conductivity of 0.05 W/(m·K) or more.

<7> The film according to any one of <1> to <6>, in which a dielectric loss tangent of the layer B is 0.01 or less.

<8> The film according to any one of <1> to <7>, in which the layer B contains a liquid crystal polymer.

<9> The film according to any one of <1> to <8>, in which the layer B contains aromatic polyester amide.

<10> The film according to any one of <1> to <9>, in which the layer B contains a thermoplastic resin having a constitutional unit having an aromatic hydrocarbon group.

<11> A laminate including: the film according to any one of <1> to <10>; and a metal layer or a metal wire disposed on at least one surface of the film.

<12> A laminate including, in the following order: a layer A; a layer B; and a metal layer or a metal wire, in which a ratio of an elastic modulus of the layer A at 160° C. to an elastic modulus of the layer B at 160° C. is 1.2 or more, and a thermal conductivity of the layer A is 0.05 W/(m·K) or more.

<13> A manufacturing method of a laminate including: a step A of applying a composition A containing a liquid crystal polymer, a filler having a thermal conductivity of 0.05 W/(m·K) or more, and a solvent to form a layer A; and a step B of applying a composition B containing a liquid crystal polymer and a solvent to form a layer B on at least one surface of the layer A.

<14> The manufacturing method of a laminate according to <13>, in which the step A and the step B are performed at the same time.

According to the embodiment of the present disclosure, it is possible to provide a film having excellent level difference followability and laser processing suitability.

In addition, according to another embodiment of the present disclosure, it is possible to provide a laminate and a manufacturing method of the same, which have excellent level difference followability and laser processing suitability.

DESCRIPTION OF THE PREFERRED EMBODIMENTS

Hereinafter, the contents of the present disclosure will be described in detail. The description of configuration requirements below is made based on representative embodiments of the present disclosure in some cases, but the present disclosure is not limited to such embodiments.

Further, in the present specification, a numerical range shown using "to" indicates a range including numerical values described before and after "to" as a lower limit and an upper limit.

In a numerical range described in a stepwise manner in the present disclosure, an upper limit or a lower limit described in one numerical range may be replaced with an upper limit or a lower limit in another numerical range described in a stepwise manner. Further, in a numerical range described in the present disclosure, an upper limit or a lower limit described in the numerical range may be replaced with a value described in an example.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

Further, the term "step" in the present specification indicates not only an independent step but also a step which cannot be clearly distinguished from other steps as long as the intended purpose of the step is achieved.

Further, in the present disclosure, "% by mass" has the same definition as that for "% by weight", and "part by mass" has the same definition as that for "part by weight".

Furthermore, in the present disclosure, a combination of two or more preferred embodiments is a more preferred embodiment.

Further, the weight-average molecular weight (Mw) and the number-average molecular weight (Mn) in the present disclosure are molecular weights converted using polystyrene as a standard substance by performing detection with a gel permeation chromatography (GPC) analysis apparatus using TSKgel SuperHM-H (trade name, manufactured by Tosoh Corporation) column, a solvent of pentafluorophenol (PFP) and chloroform at a mass ratio of 1:2, and a differential refractometer, unless otherwise specified.

Hereinafter, the present disclosure will be described in detail.

(Film)

The film according to the embodiment of the present disclosure has a layer A and a layer B on at least one surface of the layer A, in which a ratio of an elastic modulus of the layer A at 160° C. to an elastic modulus of the layer B at 160° C. is 1.2 or more, and a thermal conductivity of the layer A is 0.05 W/(m·K) or more.

The present inventors have found that it is difficult to achieve both level difference followability and laser processing suitability in a film of the related art. The "laser processing suitability" in the present disclosure is suitability for cutting processing by a laser. Specifically, the "laser ablation resistance" is a characteristic of being able to reduce excessive cutting by a laser in a case where the through-hole processing is performed. It can be said that the above-described excellent characteristics are excellent in processability of a cutting portion in laser processing into a desired shape.

For example, the present inventors have found that in a film of the related art provided with a layer with a low elastic modulus, there is a problem in that the layer with a low elastic modulus is excessively cut in a case where laser processing is performed.

The film according to the embodiment of the present disclosure includes a layer A and a layer B on at least one surface of the layer A, in which a ratio of an elastic modulus of the layer A at 160° C. to an elastic modulus of the layer B at 160° C. is 1.2 or more, and thus, a layer B having a low elastic modulus at 160° C. is provided, whereby excellent level difference followability is obtained, and a thermal conductivity of the layer A is 0.05 W/(m·K) or more, and thus, a thermal conduction coefficient of the layer A is improved, overheating of the layer A is suppressed, and thus, an increase in temperature of the layer B can be suppressed, and a film having excellent level difference followability and excellent laser processing suitability can be provided.

<Elastic Modulus of Layer a and Layer B at 160° C.>

The ratio ($MD^A/MD^B$) of the elastic modulus $MD^A$ of the layer A at 160° C. to the elastic modulus $MD^B$ of the layer B at 160° C. in the film according to the embodiment of the present disclosure is 1.2 or more. From the viewpoints of the laser processing suitability and the level difference followability, a ratio of $MD^A/MD^B$ is preferably 5 to 2,000, more preferably 100 to 1,500, and particularly preferably 350 to 1,000.

From the viewpoint of laser processing suitability and level difference followability, the elastic modulus of the layer A of the film according to the embodiment of the present disclosure at 160° C. is preferably 100 MPa to 5,000 MPa, more preferably 500 MPa to 4,000 MPa, still more preferably 800 MPa to 3,000 MPa, and particularly preferably 1,000 MPa to 2,500 MPa.

From the viewpoint of laser processing suitability and level difference followability, the elastic modulus of the layer B of the film according to the embodiment of the present disclosure at 160° C. is preferably 100 MPa or less, more preferably 10 MPa or less, still more preferably 0.001 MPa to 10 MPa, and particularly preferably 0.5 MPa to 5 MPa.

The elastic modulus in the present disclosure is measured by the following method.

First, the film or the laminate is cross-sectioned with a microtome or the like, and the layer A or the layer B is specified from an image obtained by observing the vicinity of the wiring or the like with an optical microscope. Next, the elastic modulus of the specified layer A or layer B is measured as an indentation elastic modulus using a nanoindentation method. The indentation elastic modulus is measured by using a microhardness tester (product name "DUH-W201", manufactured by Shimadzu Corporation) to apply a load at a loading rate of 0.28 mN/see with a Vickers indenter at 160° C., holding a maximum load of 10 mN for 10 seconds, and then unloading at a loading rate of 0.28 mN/sec.

In a case where each layer is measured, an unnecessary layer may be scraped off with a razor or the like to produce an evaluation sample of only the target layer. In addition, in a case where it is difficult to take out the single film because the thickness of the layer is thin, a layer to be measured may be scraped off with a razor or the like, and the obtained powdery sample may be used.

<Layer A>

The film according to the embodiment of the present disclosure has a layer A.

Further, examples of a method for detecting or determining the layer configuration, the thermal conductivity of the layer A, the thickness of each layer, and the like in the film include the following methods.

First, a cross-sectional sample of the polymer film is cut out by a microtome, and a layer configuration and a thickness of each layer are determined with an optical microscope. In a case where the determination with an optical microscope is difficult, the determination may be obtained by performing morphological observation with a scanning electron microscope (SEM), component analysis with a time-of-flight secondary ion mass spectrometry (TOF-SIMS), or the like.

In the film according to the embodiment of the present disclosure, the thermal conductivity of the layer A is 0.05 W/(m·K) or more, and from the viewpoints of the dielectric loss tangent of the film, the laser processing suitability, and the level difference followability, the thermal conductivity of the layer A is preferably 0.1 W/(m. K) or more, more preferably 0.2 W/(m·K) or more, still more preferably 1.0 W/(m·K) to 500 W/(m·K), and particularly preferably 2.0 W/(m·K) to 50 W/(m·K).

The method for measuring the thermal conductivity of the layer A or the filler in the present disclosure is as follows.

A thermal diffusivity of the layer A in the thickness direction is measured by a laser flash method using "LFA467" manufactured by Netzsch Japan K.K.

From the viewpoint of laser processing suitability, the layer A preferably contains a filler having a thermal conductivity of 0.05 W/(m·K) or more.

Examples of the material of the filler having a thermal diffusivity of 0.05 W/(m·K) or more include an inorganic nitride, an inorganic oxide, an inorganic carbide, a metal titanate, a metal, an alloy, diamond, carbon fiber, and graphite. Specific examples thereof include boron nitride, aluminum nitride, silicon nitride, silicon carbide, magnesium oxide, yttrium oxide, zirconium oxide, alumina, silica, barium titanate, strontium titanate, gold, silver, copper, aluminum, tungsten, zinc, nickel, iron, platinum, tin, an alloy of these metals, diamond, carbon fiber, and graphite.

Among these, as the filler having a thermal conductivity of 0.05 W/(m·K) or more, from the viewpoint of laser processing suitability, it is preferable to contain at least one kind of particles selected from the group consisting of boron nitride particles, aluminum nitride particles, silicon nitride particles, silicon carbide particles, diamond particles, carbon fibers, alumina particles, and silica particles, it is more preferable to contain at least one kind of particles selected from the group consisting of boron nitride particles, aluminum nitride particles, silicon nitride particles, silicon carbide particles, diamond particles, and carbon fibers, it is still more preferable to contain at least one kind of particles selected from the group consisting of boron nitride particles and aluminum nitride particles, and it is particularly preferable to contain boron nitride particles.

From the viewpoint of laser processing suitability, the volume average particle diameter of the filler having a thermal conductivity of 0.05 W/(m·K) or more is preferably in a range of 5 nm to 50 μm, more preferably in a range of 5 nm to 20 μm, and still more preferably in a range of 100 nm to 10 μm.

The volume average particle diameter of the particles in the present disclosure is obtained by measuring the diameter of each particle according to a light scattering method or capturing an electron micrograph of the particles and measuring the particle diameters of a total of 5000 particles on the photograph, and calculating the average value thereof. For nonspherical particles, the equivalent circular diameter of the particles in a photograph is adopted.

Note that unless otherwise specified, the average particle diameter of the particles in the present disclosure means a volume average particle diameter.

The layer A may contain one kind of filler having a thermal conductivity of 0.05 W/(m·K) or more alone, or may contain two or more kinds thereof.

From the viewpoint of dielectric loss tangent of the film and laser processing suitability, a content of the filler having a thermal conductivity of 0.05 W/(m· K) or higher is preferably 5% by mass to 90% by mass, more preferably 10% by mass to 90% by mass, still more preferably 20% by mass to 85% by mass, and particularly preferably 50% by mass to 85% by mass with respect to the total mass of the layer A.

From the viewpoints of the dielectric loss tangent of the film, the laser processing suitability, and the level difference followability, the dielectric loss tangent of the layer A is preferably 0.01 or less, more preferably 0.005 or less, still more preferably 0.004 or less, and particularly preferably 0.003 or less. The lower limit value is not particularly set, and examples thereof include more than 0.

The dielectric loss tangent in the present disclosure is measured by the following method.

The dielectric loss tangent is measured by a resonance perturbation method at a frequency of 10 GHz. A 10 GHz cavity resonator (CP531 manufactured by KANTO Electronic Application and Development Inc.) is connected to a network analyzer ("E8363B" manufactured by Agilent Technology Co., Ltd.), a test piece is inserted into the cavity resonator, and the dielectric loss tangent of the film is measured from change in resonance frequency before and after insertion for 96 hours under an environment of a temperature of 25° C. and humidity of 60% RH.

In a case where each layer is measured, an unnecessary layer may be scraped off with a razor or the like to produce an evaluation sample of only the target layer. In addition, in a case where it is difficult to take out the single film because the thickness of the layer is thin, a layer to be measured may be scraped off with a razor or the like, and the obtained powdery sample may be used. In the present disclosure, the measurement of the dielectric loss tangent of the polymer is carried out according to the above-described method of measuring a dielectric loss tangent by identifying or isolating a chemical structure of the polymer constituting each layer and using a powdered sample of the polymer to be measured.

From the viewpoint of the dielectric loss tangent of the film and the laser processing suitability, the layer A preferably contains a polymer having a dielectric loss tangent of 0.01 or less.

In addition, from the viewpoint of the dielectric loss tangent of the film and the laser processing suitability, the layer A preferably contains a polymer having an aromatic ring, and more preferably contains a polymer having an aromatic ring and having a dielectric loss tangent of 0.01 or less.

Further, from the viewpoint of the dielectric loss tangent of the film and the laser processing suitability, the layer A preferably contains a polymer and polymer particles, and more preferably contains a polymer having a dielectric loss tangent of 0.01 or less and particles of a polymer having a dielectric loss tangent of 0.01 or less.

From the viewpoints of the dielectric loss tangent of the film, the laser processing suitability, and the level difference followability, the dielectric loss tangent of the polymer contained in the layer A of the film according to the embodiment of the present disclosure is preferably 0.01 or less, more preferably 0.005 or less, still more preferably 0.004 or less, and particularly preferably 0.003 or less. The lower limit value is not particularly set, and examples thereof include more than 0.

From the viewpoints of the dielectric loss tangent, the level difference followability, and the heat resistance of the film, the melting point Tm or the 5% by mass reduced temperature Td of the polymer having a dielectric loss tangent of 0.01 or less is preferably 200° C. or higher, more preferably 250° C. or higher, still more preferably 280° C. or higher, and particularly preferably 300° C. or higher. The upper limit value thereof is not particularly limited, but is preferably 500° C. or lower and more preferably 420° C. or lower.

The melting point Tm in the present disclosure is defined as a value measured by a differential scanning calorimetry (DSC) device. 5 mg of a sample is put into a measurement pan of the DSC, and a peak temperature of an endothermic peak which appears in a case where the sample is heated from 30° C. at 10° C./min in a nitrogen stream is defined as the Tm of the film.

In addition, the 5%-by-mass-loss temperature Td in the present disclosure is measured with a thermogravimetric analysis (TGA) device. That is, a mass of the sample put into the measurement pan is defined as an initial value, and a temperature at which the mass is reduced by 5% by mass with respect to the initial value due to the heating is defined as the 5%-by-mass-loss temperature Td.

From the viewpoints of the dielectric loss tangent of the film, the adhesiveness to the metal (for example, the metal layer, the metal wire, and the like), and the heat resistance, the glass transition temperature Tg of the polymer having a dielectric loss tangent of 0.01 or less is preferably 150° C. or higher, and more preferably 200° C. or higher. The upper limit value thereof is not particularly limited, but is preferably lower than 350° C., preferably 280° C. or lower, and more preferably lower than 280° C.

The glass transition temperature Tg in the present disclosure is defined as a value measured by a differential scanning calorimetry (DSC) device.

A weight-average molecular weight Mw of the polymer having a dielectric loss tangent of 0.01 or less is preferably 1,000 or more, more preferably 2,000 or more, and particularly preferably 5,000 or more. In addition, the weight-average molecular weight Mw of the polymer having a dielectric loss tangent of 0.01 or less is preferably 50,000 or less, more preferably 20,000 or less, and particularly preferably less than 13,000.

In the present disclosure, the type of the polymer having a dielectric loss tangent of 0.01 or less is not particularly limited, and a known polymer can be used.

Examples of the polymer having a dielectric loss tangent of 0.01 or less include thermoplastic resins such as a liquid crystal polymer, a fluorine-based polymer, a polymerized substance of a compound which has a cyclic aliphatic hydrocarbon group and a group having an ethylenically unsaturated bond, polyether ether ketone, polyolefin, polyamide, polyester, polyphenylene sulfide, aromatic polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

Among these, from the viewpoint of dielectric loss tangent of the film, adhesiveness to metal, and heat resistance, at least one polymer selected from the group consisting of a liquid crystal polymer, a fluorine-based polymer, a polymerized substance of a compound which has a cyclic aliphatic hydrocarbon group and a group having an ethylenically unsaturated bond, polyphenylene ether, and aromatic polyether ketone is preferable, and at least one polymer selected from the group consisting of a liquid crystal polymer and a fluorine-based polymer is more preferable.

From the viewpoint of adhesiveness and mechanical strength of the film, a liquid crystal polymer is preferable, and from the viewpoint of heat resistance and dielectric loss tangent, a fluorine-based polymer is preferable.

—Liquid Crystal Polymer—

From the viewpoints of the dielectric loss tangent of the film, the laser processing suitability, and the level difference followability, the layer A in the film according to the embodiment of the present disclosure preferably includes a liquid crystal polymer.

In the present disclosure, the type of the liquid crystal polymer is not particularly limited, and a known liquid crystal polymer can be used.

In addition, the liquid crystal polymer may be a thermotropic liquid crystal polymer which exhibits liquid crystallinity in a molten state, or may be a lyotropic liquid crystal polymer which exhibits liquid crystallinity in a solution state. Further, in a case where the liquid crystal polymer is a thermotropic liquid crystal polymer, the liquid crystal polymer is preferably a liquid crystal polymer which is molten at a temperature of 450° C. or lower.

Examples of the liquid crystal polymer include a liquid crystal polyester, a liquid crystal polyester amide in which an amide bond is introduced into the liquid crystal polyester, a liquid crystal polyester ether in which an ether bond is introduced into the liquid crystal polyester, and a liquid crystal polyester carbonate in which a carbonate bond is introduced into the liquid crystal polyester.

In addition, from the viewpoints of the dielectric loss tangent, the liquid crystallinity, and the thermal expansion coefficient of the film, the liquid crystal polymer is preferably a polymer having an aromatic ring, more preferably an aromatic polyester or an aromatic polyester amide, and particularly preferably an aromatic polyester amide.

Further, the liquid crystal polymer may be a polymer in which an imide bond, a carbodiimide bond, a bond derived from an isocyanate, such as an isocyanurate bond, or the like is further introduced into the aromatic polyester or the aromatic polyester amide.

Further, it is preferable that the liquid crystal polymer is a wholly aromatic liquid crystal polymer formed of only an aromatic compound as a raw material monomer.

Examples of the liquid crystal polymer include the following liquid crystal polymers.

1) a liquid crystal polymer obtained by polycondensing (i) an aromatic hydroxycarboxylic acid, (ii) an aromatic dicarboxylic acid, and (iii) at least one compound selected from the group consisting of an aromatic diol, an aromatic hydroxyamine, and an aromatic diamine;
2) a liquid crystal polymer obtained by polycondensing a plurality of types of aromatic hydroxycarboxylic acids;
3) a liquid crystal polymer obtained by polycondensing (i) an aromatic dicarboxylic acid and (ii) at least one compound selected from the group consisting of an aromatic diol, an aromatic hydroxyamine, and an aromatic diamine;

4) a liquid crystal polymer obtained by polycondensing (i) polyester such as polyethylene terephthalate and (ii) an aromatic hydroxycarboxylic acid.

Here, the aromatic hydroxycarboxylic acid, the aromatic dicarboxylic acid, the aromatic diol, the aromatic hydroxyamine, and the aromatic diamine may be each independently replaced with a polycondensable derivative.

For example, the aromatic hydroxycarboxylic acid and the aromatic dicarboxylic acid can be replaced with aromatic hydroxycarboxylic acid ester and aromatic dicarboxylic acid ester, by converting a carboxy group into an alkoxycarbonyl group or an aryloxycarbonyl group.

The aromatic hydroxycarboxylic acid and the aromatic dicarboxylic acid can be replaced with aromatic hydroxycarboxylic acid halide and aromatic dicarboxylic acid halide, by converting a carboxy group into a haloformyl group.

The aromatic hydroxycarboxylic acid and the aromatic dicarboxylic acid can be replaced with aromatic hydroxycarboxylic acid anhydride and aromatic dicarboxylic acid anhydride, by converting a carboxy group into an acyloxycarbonyl group.

Examples of a polymerizable derivative of a compound having a hydroxy group, such as an aromatic hydroxycarboxylic acid, an aromatic diol, and an aromatic hydroxyamine, include a derivative (acylated product) obtained by acylating a hydroxy group and converting the acylated group into an acyloxy group.

For example, the aromatic hydroxycarboxylic acid, the aromatic diol, and the aromatic hydroxyamine can be each replaced with an acylated product by acylating a hydroxy group and converting the acylated group into an acyloxy group.

Examples of a polymerizable derivative of a compound having an amino group, such as an aromatic hydroxyamine or an aromatic diamine, include a derivative (acylated product) obtained by acylating an amino group and converting the acylated group to an acylamino group.

For example, the aromatic hydroxyamine and the aromatic diamine can be each replaced with an acylated product by acylating an amino group and converting the acylated group into an acylamino group.

From the viewpoint of liquid crystallinity, dielectric loss tangent of the film, and level difference followability, the liquid crystal polymer preferably has a constitutional unit represented by any of Formulae (1) to (3) (hereinafter, a constitutional unit represented by Formula (1) or the like may be referred to as a constitutional unit (1) or the like), more preferably has a constitutional unit represented by Formula (1), and particularly preferably has a constitutional unit represented by Formula (1), a constitutional unit represented by Formula (2), and a constitutional unit represented by Formula (3).

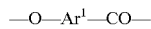 —O—Ar¹—CO—           Formula (1)

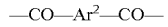 —CO—Ar²—CO—           Formula (2)

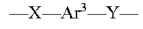 —X—Ar³—Y—           Formula (3)

In Formulae (1) to (3), Ar¹ represents a phenylene group, a naphthylene group, or a biphenylylene group, Ar² and Ar³ each independently represent a phenylene group, a naphthylene group, a biphenylylene group, or a group represented by Formula (4), X and Y each independently represent an oxygen atom or an imino group, and hydrogen atoms in Ar¹ to Ar³ may be each independently substituted with a halogen atom, an alkyl group, or an aryl group.

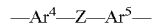 —Ar⁴—Z—Ar⁵—           Formula (4)

In Formula (4), Ar⁴ and Ar⁵ each independently represent a phenylene group or a naphthylene group, and Z represents an oxygen atom, a sulfur atom, a carbonyl group, a sulfonyl group, or an alkylene group.

Examples of the halogen atom include a fluorine atom, a chlorine atom, a bromine atom, and an iodine atom.

Examples of the alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group. The number of carbon atoms in the alkyl group is preferably 1 to 10.

Examples of the aryl group include a phenyl group, an o-tolyl group, an m-tolyl group, a p-tolyl group, a 1-naphthyl group, and a 2-naphthyl group. The number of carbon atoms in the aryl group is preferably 6 to 20.

In a case where the hydrogen atom is substituted with any of these groups, the number of each of substitutions in Ar¹, Ar², and Ar³ independently is preferably 2 or less and more preferably 1.

Examples of the alkylene group include a methylene group, a 1,1-ethanediyl group, a 1-methyl-1,1-ethanediyl group, a 1,1-butanediyl group, and a 2-ethyl-1,1-hexanediyl group. The number of carbon atoms in the alkylene group is preferably 1 to 10.

The constitutional unit (1) is a constitutional unit derived from an aromatic hydroxycarboxylic acid.

As the constitutional unit (1), an aspect in which Ar¹ represents a p-phenylene group (constitutional unit derived from p-hydroxybenzoic acid), an aspect in which Ar¹ represents a 2,6-naphthylene group (constitutional unit derived from 6-hydroxy-2-naphthoic acid), or an aspect in which Ar¹ represents a 4,4'-biphenylylene group (constitutional unit derived from 4'-hydroxy-4-biphenylcarboxylic acid) is preferable.

The constitutional unit (2) is a constitutional unit derived from an aromatic dicarboxylic acid.

As the constitutional unit (2), an aspect in which Ar² represents a p-phenylene group (constitutional unit derived from terephthalic acid), an aspect in which Ar² represents an m-phenylene group (constitutional unit derived from isophthalic acid), an aspect in which Ar² represents a 2,6-naphthylene group (constitutional unit derived from 2,6-naphthalenedicarboxylic acid), or an aspect in which Ar² represents a diphenylether-4,4'-diyl group (constitutional unit derived from diphenylether-4,4'-dicarboxylic acid) is preferable.

The constitutional unit (3) is a constitutional unit derived from an aromatic diol, an aromatic hydroxylamine, or an aromatic diamine.

As the constitutional unit (3), an aspect in which Ar³ represents a p-phenylene group (constitutional unit derived from hydroquinone, p-aminophenol, or p-phenylenediamine), an aspect in which Ar³ represents an m-phenylene group (constitutional unit derived from isophthalic acid), or an aspect in which Ar³ represents a 4,4'-biphenylylene group (constitutional unit derived from 4,4'-dihydroxybiphenyl, 4-amino-4'-hydroxybiphenyl, or 4,4'-diaminobiphenyl) is preferable.

A content of the constitutional unit (1) is preferably 30% by mole or more, more preferably 30% to 80% by mole, still more preferably 30% to 60% by mole, and particularly preferably 30% to 40% by mole with respect to the total amount of all constitutional units (a value obtained by dividing the mass of each constitutional unit (also referred to as "monomer unit") constituting the liquid crystal polymer by the formula weight of each constitutional unit to calculate an amount (mole) equivalent to the substance amount of each constitutional unit and adding up the amounts).

The content of the constitutional unit (2) is preferably 35% by mole or less, more preferably 10% by mole to 35% by mole, still more preferably 20% by mole to 35% by mole, and particularly preferably 30% by mole to 35% by mole with respect to the total amount of all constitutional units.

The content of the constitutional unit (3) is preferably 35% by mole or less, more preferably 10% by mole to 35% by mole, still more preferably 20% by mole to 35% by mole, and particularly preferably 30% by mole to 35% by mole with respect to the total amount of all constitutional units.

The heat resistance, the strength, and the rigidity are likely to be improved as the content of the constitutional unit (1) increases, but the solubility in a solvent is likely to be decreased in a case where the content thereof is extremely large.

A proportion of the content of the constitutional unit (2) to the content of the constitutional unit (3) is expressed as [content of constitutional unit (2)]/[content of constitutional unit (3)] (mol/mol), and is preferably 0.9/1 to 1/0.9, more preferably 0.95/1 to 1/0.95, and still more preferably 0.98/1 to 1/0.98.

The liquid crystal polymer may have two or more kinds of each of the constitutional units (1) to (3) independently. In addition, the liquid crystal polymer may have a constitutional unit other than the units (1) to (3). A content of the constitutional unit other than the constitutional units (1) to (3) is preferably 10% by mole or less and more preferably 5% by mole or less with respect to the total amount of all constitutional units.

From the viewpoint of solubility in a solvent, the liquid crystal polymer preferably has, as the constitutional unit (3), a constitutional unit (3) in which at least one of X or Y is an imino group. That is, the constitutional unit (3) preferably has at least one of a constitutional unit derived from an aromatic hydroxylamine or a constitutional unit derived from an aromatic diamine, and more preferably has only the constitutional unit (3) in which at least one of X or Y represents an imino group.

It is preferable that the liquid crystal polymer is produced by melt-polymerizing raw material monomers corresponding to the constitutional units constituting the liquid crystal polymer. The melt polymerization may be carried out in the presence of a catalyst. Examples of the catalyst include metal compounds such as magnesium acetate, stannous acetate, tetrabutyl titanate, lead acetate, sodium acetate, potassium acetate, and antimony trioxide, and nitrogen-containing heterocyclic compounds such as 4-(dimethylamino)pyridine and 1-methylimidazole; and preferred examples thereof include nitrogen-containing heterocyclic compounds. The melt polymerization may be further carried out by solid phase polymerization as necessary.

The lower limit value of the flow start temperature of the liquid crystal polymer is preferably 180° C. or higher, more preferably 200° C. or higher, and still more preferably 250° C. or higher. The upper limit value of the flow start temperature is preferably 350° C., more preferably 330° C., and still more preferably 310° C. In a case where the flow start temperature of the liquid crystal polymer is within the above-described range, the solubility, the heat resistance, the strength, and the rigidity are excellent, and the viscosity of the solution is appropriate.

The flow start temperature is also referred to as a flow temperature or a fluidity temperature, and is a temperature at which, in a case where the liquid crystal polymer is melted by using a capillary rheometer under a load of 9.8 MPa (100 kg/cm$^2$) and extruded from a nozzle having an inner diameter of 1 mm and a length of 10 mm while being heated at a rate of 4° C./min, a viscosity of 4,800 Pa·s (48,000 poise) is exhibited. The flow start temperature is a guide for the molecular weight of the liquid crystal polymer (see "Liquid Crystal Polymer-Synthesis, Forming, and Application-", edited by Naoyuki Koide, CMC Publishing Co., Ltd., Jun. 5, 1987, p. 95).

In addition, a weight-average molecular weight of the liquid crystal polymer is preferably 1,000,000 or less, more preferably 3,000 to 300,000, still more preferably 5,000 to 100,000, and particularly preferably 5,000 to 30,000. In a case where the weight-average molecular weight of the liquid crystal polymer is within the above-described range, a film after heat treatment is excellent in thermal conductivity, heat resistance, strength, and rigidity in the thickness direction.

—Fluorine-Based Polymer—

From the viewpoint of heat resistance and mechanical strength, the polymer having a dielectric loss tangent of 0.01 or less is preferably a fluorine-based polymer.

In the present disclosure, the type of the fluorine-based polymer used as the polymer having a dielectric loss tangent of 0.01 or less is not particularly limited as long as the dielectric loss tangent thereof is 0.01 or less, and a known fluorine-based polymer can be used.

Examples of the fluorine-based polymer include polytetrafluoroethylene, polychlorotrifluoroethylene, polyvinylidene fluoride, polyvinyl fluoride, a perfluoroalkoxy fluororesin, an ethylene tetrafluoride/propylene hexafluoride copolymer, an ethylene/ethylene tetrafluoride copolymer, and an ethylene/chlorotrifluoroethylene copolymer.

Among these, polytetrafluoroethylene is preferable.

In addition, examples of the fluorine-based polymer include a fluorinated α-olefin monomer, that is, an α-olefin monomer containing at least one fluorine atom; and a homopolymer and a copolymer optionally containing a constitutional unit derived from a non-fluorinated ethylenically unsaturated monomer reactive to the fluorinated α-olefin monomer.

Examples of the fluorinated α-olefin monomer include $CF_2=CF_2$, $CHF=CF_2$, $CH_2=CF_2$, $CHCl=CHF$, $CClF=CF_2$, $CCl_2=CF_2$, $CClF=CClF$, $CHF=CCl_2$, $CH_2=CClF$, $CCl_2=CClF$, $CF_3CF=CF_2$, $CF_3CF=CHF$, $CF_3CH=CF_2$, $CF_3CH=CH_2$, $CHF_2CH=CHF$, $CF_3CF=CF_2$, and perfluoro (alkyl having 2 to 8 carbon atoms) vinyl ether (for example, perfluoromethyl vinyl ether, perfluoropropyl vinyl ether, and perfluorooctyl vinyl ether). Among these, at least one monomer selected from the group consisting of tetrafluoroethylene ($CF_2=CF_2$), chlorotrifluoroethylene ($CClF=CF_2$), (perfluorobutyl)ethylene, vinylidene fluoride ($CH_2=CF_2$), and hexafluoropropylene ($CF_2=CFCF_3$) is preferable.

Examples of the non-fluorinated monoethylenically unsaturated monomer include ethylene, propylene, butene, and an ethylenically unsaturated aromatic monomer (for example, styrene and α-methylstyrene).

The fluorinated α-olefin monomer may be used alone or in combination of two or more thereof.

In addition, the non-fluorinated ethylenically unsaturated monomer may be used alone or in combination of two or more thereof.

Examples of the fluorine-based polymer include polychlorotrifluoroethylene (PCTFE), poly(chlorotrifluoroethylene-propylene), poly(ethylene-tetrafluoroethylene) (ETFE), poly(ethylene-chlorotrifluoroethylene) (ECTFE), poly(hexafluoropropylene), poly(tetrafluoroethylene) (PTFE), poly(tetrafluoroethylene-ethylene-propylene), poly(tetrafluoroethylene-hexafluoropropylene) (FEP), poly(tetrafluoroethylene-propylene) (FEPM), poly(tetrafluoroethylene-perfluoropropylene vinyl ether), poly(tetrafluoroethylene-perfluoroalkyl vinyl ether) (PFA) (for example, poly(tetrafluoroethylene-perfluoropropyl vinyl ether)), polyvinyl fluoride (PVF), polyvinylidene fluoride (PVDF), poly(vinylidene fluoride-chlorotrifluoroethylene), perfluoropolyether, perfluorosulfonic acid, and perfluoropolyoxetane.

The fluorine-based polymer may be used alone or in combination of two or more thereof.

The fluorine-based polymer is preferably at least one of FEP, PFA, ETFE, or PTFE. The FEP is available from Du Pont as the trade name of TEFLON (registered trademark) FEP or from DAIKIN INDUSTRIES, LTD. as the trade name of NEOFLON FEP; and the PFA is available from DAIKIN INDUSTRIES, LTD. as the trade name of NEOFLON PFA, from Du Pont as the trade name of TEFLON (registered trademark) PFA, or from Solvay Solexis as the trade name of HYFLON PFA.

The fluorine-based polymer preferably includes PTFE. The PTFE can be included as a PTFE homopolymer, a partially modified PTFE homopolymer, or a combination including one or both of these. The partially modified PTFE homopolymer preferably contains a constitutional unit derived from a comonomer other than tetrafluoroethylene in an amount of less than 1% by mass based on the total mass of the polymer.

The fluorine-based polymer may be a crosslinkable fluoropolymer having a crosslinkable group. The crosslinkable fluoropolymer can be crosslinked by a known crosslinking method in the related art. One of the representative crosslinkable fluoropolymers is a fluoropolymer having a (meth)acryloxy group. For example, the crosslinkable fluoropolymer may be represented by Formula:

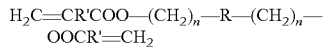

In the formula, R is a fluorine-based oligomer chain having two or more constitutional units derived from a fluorinated α-olefin monomer or a non-fluorinated monoethylenically unsaturated monomer, R' is H or —CH$_3$, and n is 1 to 4. R may be a fluorine-based oligomer chain having a constitutional unit derived from tetrafluoroethylene.

In order to initiate a radical crosslinking reaction through the (meth)acryloxy group in the fluorine-based polymer, by exposing the fluoropolymer having a (meth)acryloxy group to a free radical source, a crosslinked fluoropolymer network can be formed. The free radical source is not particularly limited, and suitable examples thereof include a photoradical polymerization initiator and an organic peroxide. Appropriate photoradical polymerization initiators and organic peroxides are well known in the art. The crosslinkable fluoropolymer is commercially available, and examples thereof include Viton B manufactured by Du Pont.

—Polymerized Substance of Compound which has Cyclic Aliphatic Hydrocarbon Group and Group Having Ethylenically Unsaturated Bond—

The polymer having a dielectric loss tangent of 0.01 or less may be a polymerized substance of a compound which has a cyclic aliphatic hydrocarbon group and a group having an ethylenically unsaturated bond.

Examples of the polymerized substance of a compound which has a cyclic aliphatic hydrocarbon group and a group having an ethylenically unsaturated bond include thermoplastic resins having a constitutional unit formed from a monomer having a cyclic olefin such as norbornene and a polycyclic norbornene-based monomer, which is also referred to as a thermoplastic cyclic olefin-based resin.

The polymerized substance of a compound which has a cyclic aliphatic hydrocarbon group and a group having an ethylenically unsaturated bond may be a ring-opened polymer of the above-described cyclic olefin, a hydrogenated product of a ring-opened copolymer using two or more cyclic olefins, or an addition polymer of a cyclic olefin and a linear olefin or aromatic compound having an ethylenically unsaturated bond such as a vinyl group. In addition, a polar group may be introduced into the polymerized substance of a compound which has a cyclic aliphatic hydrocarbon group and a group having an ethylenically unsaturated bond.

The polymerized substance of a compound which has a cyclic aliphatic hydrocarbon group and a group having an ethylenically unsaturated bond may be used alone or in combination of two or more thereof.

A ring structure of the cyclic aliphatic hydrocarbon group may be a single ring, a fused ring in which two or more rings are fused, or a crosslinked ring.

Examples of the ring structure of the cyclic aliphatic hydrocarbon group include a cyclopentane ring, a cyclohexane ring, a cyclooctane ring, an isophorone ring, a norbornane ring, and a dicyclopentane ring.

The compound which has a cyclic aliphatic hydrocarbon group and a group having an ethylenically unsaturated bond may be a monofunctional ethylenically unsaturated compound or a polyfunctional ethylenically unsaturated compound.

The number of cyclic aliphatic hydrocarbon groups in the compound which has a cyclic aliphatic hydrocarbon group and a group having an ethylenically unsaturated bond may be 1 or more, and may be 2 or more.

It is sufficient that the polymerized substance of a compound which has a cyclic aliphatic hydrocarbon group and a group having an ethylenically unsaturated bond is a polymer obtained by polymerizing at least one compound which has a cyclic aliphatic hydrocarbon group and a group having an ethylenically unsaturated bond, and it may be a polymerized substance of two or more kinds of the compound which has a cyclic aliphatic hydrocarbon group and a group having an ethylenically unsaturated bond or a copolymer with other ethylenically unsaturated compounds having no cyclic aliphatic hydrocarbon group.

In addition, the polymerized substance of a compound which has a cyclic aliphatic hydrocarbon group and a group having an ethylenically unsaturated bond is preferably a cycloolefin polymer.

—Polyphenylene Ether—

The layer A preferably contains a polyphenylene ether.

In a case where heat curing is performed after film formation, from the viewpoint of heat resistance and film-forming property, a weight-average molecular weight (Mw) of the polyphenylene ether is preferably 500 to 5,000 and more preferably 500 to 3,000. In addition, in a case where the heat curing is not performed, the weight-average molecular weight (Mw) of the polyphenylene ether is not particularly limited, but is preferably 3,000 to 100,000 and more preferably 5,000 to 50,000.

In the polyphenylene ether, from the viewpoint of dielectric loss tangent and heat resistance, the average number of molecular terminal phenolic hydroxyl groups per molecule (the number of terminal hydroxyl groups) is preferably 1 to 5 and more preferably 1.5 to 3.

The number of hydroxyl groups or the phenolic hydroxyl groups in the polyphenylene ether can be found, for example, from a standard value of a product of the polyphenylene ether. In addition, examples of the number of terminal hydroxyl groups or the number of terminal phenolic hydroxyl groups include a numerical value representing an average value of hydroxyl groups or phenolic hydroxyl groups per molecule of all polyphenylene ethers present in 1 mol of the polyphenylene ether.

The polyphenylene ether may be used alone or in combination of two or more thereof.

Examples of the polyphenylene ether include a polyphenylene ether including 2,6-dimethylphenol and at least one of bifunctional phenol or trifunctional phenol, and a compound mainly including the polyphenylene ether, such as poly(2,6-dimethyl-1,4-phenylene oxide). More specifically, for example, a compound having a structure represented by Formula (PPE) is preferable.

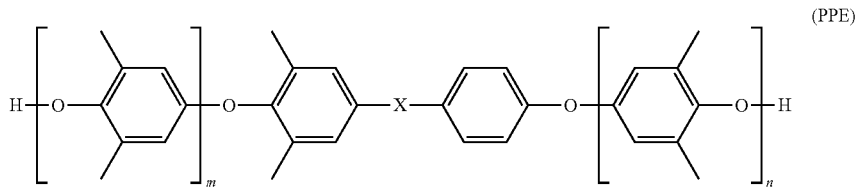

(PPE)

In Formula (PPE), X represents an alkylene group having 1 to 3 carbon atoms or a single bond, m represents an integer of 0 to 20, n represents an integer of 0 to 20, and the sum of m and n represents an integer of 1 to 30.

Examples of the alkylene group in X described above include a dimethylmethylene group.

—Aromatic Polyether Ketone—

The polymer having a dielectric loss tangent of 0.01 or less may be an aromatic polyether ketone.

The aromatic polyether ketone is not particularly limited, and a known aromatic polyether ketone can be used.

The aromatic polyether ketone is preferably a polyether ether ketone.

The polyether ether ketone is one type of the aromatic polyether ketone, and is a polymer in which bonds are arranged in the order of an ether bond, an ether bond, and a carbonyl bond (ketone). It is preferable that the bonds are linked to each other by a divalent aromatic group.

The aromatic polyether ketone may be used alone or in combination of two or more thereof.

Examples of the aromatic polyether ketone include polyether ether ketone (PEEK) having a chemical structure represented by Formula (P1), polyether ketone (PEK) having a chemical structure represented by Formula (P2), polyether ketone ketone (PEKK) having a chemical structure represented by Formula (P3), polyether ether ketone ketone (PEEKK) having a chemical structure represented by Formula (P4), and polyether ketone ether ketone ketone (PEKEKK) having a chemical structure represented by Formula (P5).

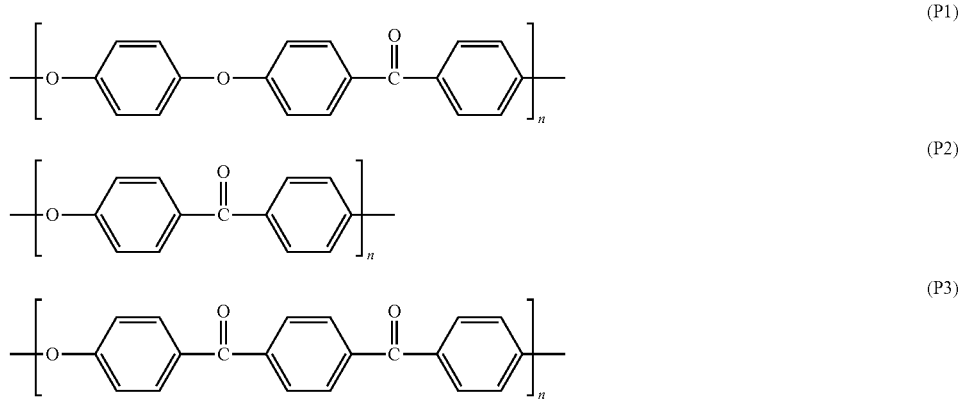

(P1)

(P2)

(P3)

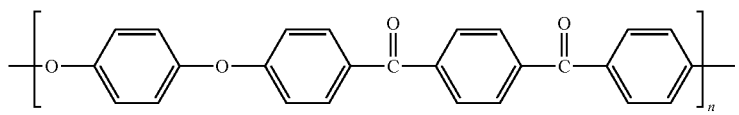
(P4)

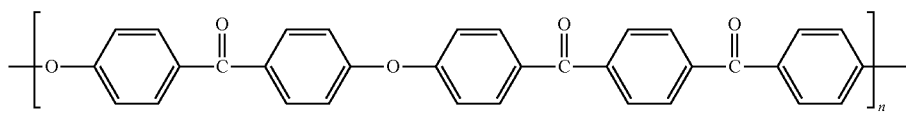
(P5)

From the viewpoint of mechanical properties, each n of Formulae (P1) to (P5) is preferably 10 or more and more preferably 20 or more. On the other hand, from the viewpoint that the aromatic polyether ketone can be easily produced, n is preferably 5,000 or less and more preferably 1,000 or less. That is, n is preferably 10 to 5,000 and more preferably 20 to 1,000.

The polymer having a dielectric loss tangent of 0.01 or less is preferably a polymer soluble in a specific organic solvent (hereinafter, also referred to as "soluble polymer").

Specifically, the soluble polymer in the present disclosure is a liquid crystal polymer in which 0.1 g or more thereof is dissolved at 25° C. in 100 g of at least one solvent selected from the group consisting of N-methylpyrrolidone, N-ethylpyrrolidone, dichloromethane, dichloroethane, chloroform, N,N-dimethylacetamide, γ-butyrolactone, dimethylformamide, ethylene glycol monobutyl ether, and ethylene glycol monoethyl ether.

The layer A may contain only one kind of polymer having a dielectric loss tangent of 0.01 or less, or may contain two or more kinds thereof.

From the viewpoint of the dielectric loss tangent of the film and the adhesiveness to the metal, the content of the polymer having a dielectric loss tangent of 0.01 or less, preferably a liquid crystal polymer, in the layer A is preferably 10% by mass to 90% by mass, more preferably 15% by mass to 85% by mass, still more preferably 15% by mass to 80% by mass, and particularly preferably 15% by mass to 50% by mass with respect to the total mass of the layer A.

The content of the polymer having a dielectric loss tangent of 0.01 or less also includes the content of the polymer having a particulate dielectric loss tangent of 0.01 or less, which will be described later, is.

—Filler—

The layer A may contain a filler from the viewpoints of a thermal expansion coefficient and a level difference followability.

The filler may be particulate or fibrous, and may be an inorganic filler or an organic filler. However, from the viewpoints of the dielectric loss tangent of the film, the laser processing suitability, and the level difference followability, an organic filler is preferable.

In the film according to the embodiment of the present disclosure, from the viewpoint of the thermal expansion coefficient and the level difference followability, the number density of the filler is preferably larger inside the film than the surface of the film.

Here, the surface of the film refers to a surface (surface in contact with air or substrate) of the film outside, and a smaller one of a range of 3 μm in a depth direction from the most surface or a range of 10% or less of the thickness of the entire film from the most surface is defined as the "surface". The inside of the film refers to a portion other than the surface of the film, that is, a surface (a surface not in contact with air or a substrate) inside the film, and is not limited, but in a range of ±1.5 μm from the center in the thickness direction of the film or in a range of ±5% of the total thickness from the center in the thickness direction of the film, one having a smaller numerical value is defined as "inside".

As the organic filler, a known organic filler can be used.

Examples of a material of the organic filler include polyethylene, polystyrene, urea-formalin filler, polyester, cellulose, acrylic resin, fluororesin, cured epoxy resin, crosslinked benzoguanamine resin, crosslinked acrylic resin, a liquid crystal polymer, and a material containing two or more kinds of these.

In addition, the organic filler may be fibrous, such as nanofibers, or may be hollow resin particles.

Among these, as the organic filler, from the viewpoint of the dielectric loss tangent of the film, the laser processing suitability, and the level difference followability, fluororesin particles, polyester-based resin particles, polyethylene particles, liquid crystal polymer particles, or cellulose-based resin nanofibers are preferable, polytetrafluoroethylene particles, polyethylene particles, or liquid crystal polymer particles are more preferable, and liquid crystal polymer particles are particularly preferable. Here, the liquid crystal polymer particles are not limited, but refer to particles obtained by polymerizing a liquid crystal polymer and crushing the liquid crystal polymer with a crusher or the like to obtain powdery liquid crystal. The liquid crystal polymer particles are preferably smaller than the thickness of each layer.

From the viewpoints of the dielectric loss tangent of the film, the laser processing suitability, and the level difference followability, the average particle diameter of the organic filler is preferably 5 nm to 20 μm and more preferably 100 nm to 10 μm.

As the inorganic filler, a known inorganic filler can be used.

Examples of the material of the inorganic filler include the above-described fillers having a thermal conductivity of 0.05 W/(m·K) or more, and glass fibers, aluminum hydroxide, calcium carbonate, and a material containing two or more kinds thereof.

An average particle diameter of the inorganic filler is preferably approximately 20% to approximately 40% of the thickness of a layer A, and for example, the average particle diameter may be selected from 25%, 30%, or 35% of the thickness of the layer A. In a case where the particles or fibers are flat, the average particle diameter indicates a length in a short side direction.

In addition, from the viewpoint of thermal expansion coefficient and level difference followability, the average particle diameter of the inorganic filler is preferably 5 nm to 20 µm, more preferably 10 nm to 10 µm, still more preferably 20 nm to 1 µm, and particularly preferably 25 nm to 500 nm.

The layer A may contain only one or two or more kinds of the fillers.

From the viewpoint of level difference followability, the content of the filler in the layer A is preferably lower than the content of the filler in the layer B.

In addition, from the viewpoint of laser processing suitability and level difference followability, the content of the filler in the layer A is preferably 10% by mass to 50% by mass and more preferably 20% by mass to 40% by mass with respect to the total mass of the layer A.

A content of a filler such as polyethylene and an olefin-based elastomer is, for example, preferably 50% by volume to 90% by volume, and more preferably 75% by volume to 85% by volume. In this case, the content of the filler in the layer A is preferably 55% by mass to 90% by mass, and more preferably 80% by mass to 85% by mass with respect to the total mass of the layer A.

—Other Additives—

The layer A may contain an additive other than the above-described components.

Known additives can be used as other additives. Specific examples of the other additives include a curing agent, a leveling agent, an antifoaming agent, an antioxidant, an ultraviolet absorbing agent, a flame retardant, and a colorant.

In addition, the layer A may contain other resins other than the above-described polymer and polymer particles as other additives.

Examples of other resins include thermoplastic resins such as polypropylene, polyamide, polyester, polyphenylene sulfide, polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

The total content of the other additives in the layer A is preferably 25 parts by mass or less, more preferably 10 parts by mass or less, and still more preferably 5 parts by mass or less with respect to 100 parts by mass of the content of the polymer having a dielectric loss tangent of 0.01 or less.

From the viewpoints of the dielectric loss tangent of the film and the adhesiveness to the metal, the average thickness of the layer A is preferably thicker than the average thickness of the layer B.

From the viewpoint of dielectric loss tangent of the film and adhesiveness to the metal, a value of $T^A/T^B$, which is a ratio of the average thickness $T^A$ of the layer A to the average thickness $T^B$ of the layer B, is preferably 0.8 to 10, more preferably 1 to 5, still more preferably more than 1 and 3 or less, and particularly preferably more than 1 and 2 or less.

In addition, an average thickness of the layer A is not particularly limited, but from the viewpoint of the dielectric loss tangent of the film and the level difference followability, is preferably 5 µm to 90 µm, more preferably 10 µm to 70 µm, and particularly preferably 15 µm to 50 µm.

A method of measuring the average thickness of each layer in the film according to the embodiment of the present disclosure is as follows.

The thickness of each layer is evaluated by cutting the film with a microtome and observing the cross section with an optical microscope. Three or more sites of the cross-sectional sample are cut out, the thickness is measured at three or more points in each cross section, and the average value thereof is defined as the average thickness.

<Layer B>

The film according to the embodiment of the present disclosure includes a layer B on at least one surface of the layer A.

From the viewpoints of the dielectric loss tangent of the film, the laser processing suitability, and the level difference followability, the dielectric loss tangent of the layer B is preferably 0.01 or less, more preferably 0.005 or less, still more preferably 0.004 or less, and particularly preferably 0.003 or less. The lower limit values of both cases are not particularly set, and examples thereof include a value of more than 0.

From the viewpoints of the dielectric loss tangent of the film and the level difference followability, the layer B preferably contains a polymer having a dielectric loss tangent of 0.01 or less.

The preferred aspect of the polymer having a dielectric loss tangent of 0.01 or less, which is used for the layer B, is the same as the preferred aspect of the polymer having a dielectric loss tangent of 0.01 or less, which is used for the layer A, except as described later.

The polymer having a dielectric loss tangent of 0.01 or less, which is contained in the layer B, may be the same as or different from the polymer having a dielectric loss tangent of 0.01 or less, which is contained in the layer A, but from the viewpoint of the adhesiveness between the layer A and the layer B and the laser processing suitability, the layer B preferably contains the same polymer as the polymer having a dielectric loss tangent of 0.01 or less, which is contained in the layer A.

The layer B may contain only one kind of polymer having a dielectric loss tangent of 0.01 or less, or may contain two or more kinds thereof.

A content proportion of the polymer having a dielectric loss tangent of 0.01 or less in the layer B is preferably equal to or larger than a content proportion of the polymer having a dielectric loss tangent of 0.01 or less in the layer A.

From the viewpoints of the dielectric loss tangent of the film, the laser processing suitability, and the level difference followability, the content of the polymer having a dielectric loss tangent of 0.01 or less in the layer B is preferably 20% by mass to 100% by mass, more preferably 30% by mass to 100% by mass, and particularly preferably 40% by mass to 100% by mass with respect to the total mass of the layer B.

In addition, the layer B may contain a polymer other than the polymer having a dielectric loss tangent of 0.01 or less as a binder polymer.

From the viewpoints of the dielectric loss tangent, the laser processing suitability, and the level difference followability of the film, preferred examples of the other polymer include a thermoplastic resin including a thermoplastic elastomer. The elastomer refers to a polymer compound exhibiting elastic deformation. That is, the elastomer corresponds to a polymer compound having a property of being deformed according to an external force in a case where the external force is applied and of being recovered to an original shape in a short time in a case where the external force is removed.

Examples of the thermoplastic resin include a polyurethane resin, a polyester resin, a (meth)acrylic resin, a polystyrene resin, a fluororesin, a polyimide resin, a fluorinated polyimide resin, a polyamide resin, a polyamideimide resin, a polyether imide resin, a cellulose acylate resin, a polyether ether ketone resin, a polycarbonate resin, a polyolefin resin (for example, a polyethylene resin, a polypropylene resin, a resin consisting of a cyclic olefin copolymer, and an alicyclic polyolefin resin), a polyarylate resin, a polyether sulfone resin, a polysulfone resin, a fluorene ring-modified polycarbonate resin, an alicyclic ring-modified polycarbonate resin, and a fluorene ring-modified polyester resin.

The thermoplastic elastomer is not particularly limited, and examples thereof include an elastomer including a constitutional repeating unit derived from styrene (polystyrene-based elastomer), a polyester-based elastomer, a polyolefin-based elastomer, a polyurethane-based elastomer, a polyamide-based elastomer, a polyacrylic elastomer, a silicone-based elastomer, and a polyimide-based elastomer. The thermoplastic elastomer may be a hydride.

Examples the polystyrene-based elastomer include a styrene-butadiene-styrene block copolymer (SBS), a styrene-isoprene-styrene block copolymer (SIS), a polystyrene-poly(ethylene-propylene) diblock copolymer (SEP), a polystyrene-poly(ethylene-propylene)-polystyrene triblock copolymer (SEPS), a styrene-ethylene-butylene-styrene block copolymer (SEBS), a polystyrene-poly(ethylene/ethylene-propylene)-polystyrene triblock copolymer (SEEPS), and hydrides thereof.

Among these, from the viewpoint of the dielectric loss tangent of the film, the laser processing suitability, and the level difference followability, the layer B preferably contains, as other polymers, a thermoplastic resin having an aromatic hydrocarbon group-containing constitutional unit, more preferably contains a polystyrene-based elastomer, and particularly preferably contains a hydrogenated styrene-ethylene-butylene-styrene block copolymer.

In addition, as the other polymer, a hydrogenated polystyrene-based elastomer is preferable from the viewpoints of the dielectric loss tangent, the laser processing suitability, and the level difference followability of the film.

The content of the other polymer than the liquid crystal polymer is not particularly limited, but from the viewpoints of the dielectric loss tangent, the laser processing suitability, and the level difference followability, the content is preferably 20% by mass to 100% by mass, more preferably 30% by mass to 95% by mass, and particularly preferably 40% by mass to 90% by mass with respect to the total mass of the layer B.

From the viewpoints of the dielectric loss tangent of the film, the laser processing suitability, and the level difference followability, it is more preferable that the layer B includes a filler.

Preferred aspects of the filler which is used in the layer B are the same as the preferred aspects of the filler which is used in the layer A, except as described below.

In addition, as the filler used in the layer B, the particles of the above-described thermoplastic resin are also preferably mentioned.

Further, from the viewpoints of the dielectric loss tangent of the film, the laser processing suitability, and the level difference followability, at least one of the binder polymer or the filler contained in the layer B is preferably a polymer having a dielectric loss tangent of 0.01 or less, and more preferably a liquid crystal polymer.

In addition, from the viewpoints of the dielectric loss tangent of the film, the laser processing suitability, and the level difference followability, the layer B preferably includes inorganic particles as a filler, more preferably includes at least one kind of particles selected from the group consisting of silica particles and alumina particles, and particularly preferably includes silica particles.

The layer B may contain only one or two or more kinds of the fillers.

In addition, from the viewpoint of laser processing suitability and level difference followability, the content of the filler in the layer B is preferably 1% by mass to 80% by mass, more preferably 5% by mass to 50% by mass, and particularly preferably 20% by mass to 40% by mass with respect to the total mass of the layer B.

From the viewpoint of adhesiveness to the metal, the layer B preferably contains a compound having a functional group. The above-described functional group is preferably at least one group selected from the group consisting of a covalent-bondable group, an ion-bondable group, a hydrogen-bondable group, a dipole-interactable group, and a curing reactive group.

It is presumed that the adhesiveness to the metal is improved because the compound having a functional group contained in the layer B interacts with or is bonded to the metal or a group present in a surface of the metal.

In addition, the compound having the above-described functional group may interact, bond, or entangle with the polymer contained in the layer B. Examples of the entanglement include an aspect in which a continuous phase of a compound having a functional group and a continuous phase of a polymer having a dielectric loss tangent of 0.01 or less mutually invade each other, and an aspect in which a friction coefficient increases due to a form of each continuous phase.

In the laminate described later, in a case where the metal layer or the metal wire in contact with the layer B is subjected to a surface treatment, a functional group capable of interacting with or bonding to a group present on the surface of the metal is preferable.

The compound having a functional group may be a low-molecular-weight compound or a high-molecular-weight compound.

From the viewpoint of compatibility between the polymer having a dielectric loss tangent of 0.01 or less and the compound having a functional group and viewpoint of dielectric loss tangent of the film, the compound having a functional group is preferably a low-molecular-weight compound, and from the viewpoint of heat resistance of the polymer film and mechanical strength, the compound having a functional group is preferably a high-molecular-weight compound.

It is sufficient that the number of functional groups in the compound having a functional group is 1 or more, and it may be 2 or more. However, the number of functional groups in the compound having a functional group is preferably 2 or more, and from the viewpoint of reducing the dielectric loss tangent of the polymer film by setting the amount of functional groups to an appropriate amount, it is preferably 10 or less.

In addition, the compound having a functional group may have only one kind of functional group, or two or more kinds of functional groups.

From the viewpoint of adhesiveness to the metal, the low-molecular-weight compound used as the compound having a functional group preferably has a molecular weight of 50 or more and less than 2,000, more preferably has a molecular weight of 100 or more and less than 1,000, and particularly preferably has a molecular weight of 200 or more and less than 1,000.

In a case where the compound having a functional group is a low-molecular-weight compound, the spread of the compound is narrow, and in order to increase the contact probability between the functional groups, a content of the compound having a functional group is preferably 10% by mass or more with respect to the total mass of the layer B.

In addition, from the viewpoint of adhesiveness to the metal, the high-molecular-weight compound used as the compound having a functional group is preferably a polymer having a weight-average molecular weight of 1,000 or more, more preferably a polymer having a weight-average molecular weight of 2,000 or more, still more preferably a polymer having a weight-average molecular weight of 3,000 or more and 1,000,000 or less, and particularly preferably a polymer having a weight-average molecular weight of 5,000 or more and 200,000 or less.

Furthermore, from the viewpoint of dielectric loss tangent of the film and adhesiveness to the metal, it is preferable that the polymer having a dielectric loss tangent of 0.01 or less and the compound having a functional group are compatible with each other. Here, "compatible with each other" means that phase separation is not observed inside the layer B.

From the viewpoint of compatibility between the polymer having a dielectric loss tangent of 0.01 or less and the compound having a functional group, dielectric loss tangent of the polymer film, and adhesiveness to the metal, a difference between an SP value of the polymer having a dielectric loss tangent of 0.01 or less, which is determined by Hoy method, and an SP value of the compound having a functional group, which is determined by Hoy method, is preferably 5 MPa$^{0.5}$ or less. The lower limit value thereof is 0 MPa$^{0.5}$.

The solubility parameter value (SP value) determined by Hoy method is calculated from the molecular structure of the resin by the method described in Polymer Handbook fourth edition. In addition, in a case where the resin is a mixture of a plurality of types of resins, the SP value is obtained by calculating an SP value of each constitutional unit.

<<Functional Group>>

The functional group in the compound having a functional group is preferably at least one group selected from the group consisting of a covalent-bondable group, an ion-bondable group, a hydrogen-bondable group, a dipole-interactable group, and a curing reactive group.

From the viewpoint of adhesiveness to the metal, the functional group is preferably a covalent-bondable group or a curing reactive group, and more preferably a covalent-bondable group.

In addition, from the viewpoint of storage stability and handleability, the functional group is preferably an ion-bondable group, a hydrogen-bondable group, or a dipole-interactable group.

—Covalent-Bondable Group—

The covalent-bondable group is not particularly limited as long as the group is capable of forming a covalent bond, and examples thereof include an epoxy group, an oxetanyl group, an isocyanate group, an acid anhydride group, a carbodiimide group, a N-hydroxy ester group, a glyoxal group, an imidoester group, a halogenated alkyl group, a thiol group, a hydroxy group, a carboxy group, an amino group, an amide group, an aldehyde group, and a sulfonic acid group. Among these, from the viewpoint of adhesiveness to the metal, the covalent-bondable group is preferably at least one functional group selected from the group consisting of an epoxy group, an oxetanyl group, an N-hydroxy ester group, an isocyanate group, an imide ester group, a halogenated alkyl group, and a thiol group, and particularly preferably an epoxy group.

In addition, as will be described later, it is preferable that the surface of the metal to be bonded has a group which is paired with the functional group in the compound having a functional group.

Specific examples of a combination of the covalent-bondable groups (a combination of the functional group in the compound having a functional group and the group present in the surface of the metal) include an aspect in which, for example, in a case where one is an epoxy group or an oxetanyl group, the other is a hydroxy group or an amino group.

Examples thereof also include an aspect in which, for example, in a case where one is an N-hydroxy ester group or an imide ester group, the other is an amino group.

—Ion-Bondable Group—

Examples of the ion-bondable group include a cationic group and an anionic group.

The above-described cationic group is preferably an onium group. Examples of the onium group include an ammonium group, a pyridinium group, a phosphonium group, an oxonium group, a sulfonium group, a selenonium group, and an iodonium group. Among these, from the viewpoint of adhesiveness to the metal, an ammonium group, a pyridinium group, a phosphonium group, or a sulfonium group is preferable, an ammonium group or a phosphonium group is more preferable, and an ammonium group is particularly preferable.

The anionic group is not particularly limited, and examples thereof include a phenolic hydroxyl group, a carboxy group, —SO$_3$H, —OSO$_3$H, —PO$_3$H, —OPO$_3$H$_2$, —CONHSO$_2$—, and —SO$_2$NHSO$_2$—. Among these, a phosphoric acid group, a phosphonic acid group, a phosphinic acid group, a sulfuric acid group, a sulfonic acid group, a sulfinic acid group, or a carboxy group is preferable, a phosphoric acid group or a carboxy group is more preferable, and a carboxy group is still more preferable.

Specific examples of a combination of the ion-bondable groups (a combination of the functional group in the compound having a functional group and the group present in the surface of the metal) include an aspect in which, for example, in a case where one is an acidic group, the other is a basic group.

Examples of the above-described acidic group include a carboxy group, a sulfo group, and a phosphoric acid group, and a carboxy group is preferable.

In addition, examples thereof include an aspect in which, for example, in a case where one is a carboxy group, the ion-bondable group with the carboxy group is a tertiary amino group, a pyridyl group, or a piperidyl group.

—Hydrogen-Bondable Group—

Examples of the hydrogen-bondable group include a group having a hydrogen-bond-donating moiety and a group having a hydrogen-bond-accepting moiety.

It is sufficient that the hydrogen-bond-donating moiety has a structure having an active hydrogen atom capable of hydrogen bonding, and a structure represented by X—H is preferable.

X represents a heteroatom, and is preferably a nitrogen atom or an oxygen atom.

From the viewpoint of adhesiveness to the metal, as the above-described hydrogen-bond-donating moiety, at least one structure selected from the group consisting of a hydroxy group, a carboxy group, a primary amide group, a secondary amide group, a primary amino group, a secondary amino group, a primary sulfonamide group, a secondary sulfonamide group, an imide group, a urea bond, and a urethane bond is preferable; at least one structure selected from the group consisting of a hydroxy group, a carboxy group, a primary amide group, a secondary amide group, a primary sulfonamide group, a secondary sulfonamide group, a maleimide group, a urea bond, and a urethane bond is more preferable; at least one structure selected from the group consisting of a hydroxy group, a carboxy group, a primary amide group, a secondary amide group, a primary sulfonamide group, a secondary sulfonamide group, and a maleimide group is still more preferable; and at least one structure selected from the group consisting of a hydroxy group and a secondary amide group is particularly preferable.

The above-described hydrogen-bond-accepting moiety may be a structure containing an atom with an unshared electron pair, and a structure containing an oxygen atom with an unshared electron pair is preferable; at least one structure selected from the group consisting of a carbonyl group (including a carbonyl structure such as a carboxy group, an amide group, an imide group, a urea bond, and a urethane bond) and a sulfonyl group (including a sulfonyl structure such as a sulfonamide group) is more preferable; and a carbonyl group (including a carbonyl structure such as a carboxy group, an amide group, an imide group, a urea bond, and a urethane bond) is particularly preferable.

As the hydrogen-bondable group, a group having both the hydrogen-bond-donating moiety and the hydrogen-bond-accepting moiety described above is preferable; it is preferable to have a carboxy group, an amide group, an imide group, a urea bond, a urethane bond, or a sulfonamide group; and it is more preferable to have a carboxy group, an amide group, an imide group, or a sulfonamide group.

Specific examples of a combination of the hydrogen-bondable groups (a combination of the functional group in the compound having a functional group and the group present in the surface of the metal) include an aspect in which, in a case where one is a group having a hydrogen-bond-donating moiety, the other is a group having a hydrogen-bond-accepting moiety.

Examples thereof include an aspect in which, in a case where one is a carboxy group, the other is an amide group or a carboxy group.

Examples thereof also include an aspect in which, in a case where one is a phenolic hydroxyl group, the other is a phenolic hydroxide.

—Dipole-Interactable Group—

It is sufficient that the dipole-interactable group is a group having a polarized structure other than the above-described structure represented by X—H (X represents a heteroatom, for example, a nitrogen atom or an oxygen atom) in the hydrogen-bondable group, and suitable examples thereof include a group in which atoms with different electronegativities are bonded to each other.

As a combination of the atoms with different electronegativities, a combination of at least one atom selected from the group consisting of an oxygen atom, a nitrogen atom, a sulfur atom, and a halogen atom, and a carbon atom is preferable; and a combination of at least one atom selected from the group consisting of an oxygen atom, a nitrogen atom, and a sulfur atom, and a carbon atom is more preferable.

Among these, from the viewpoint of adhesiveness to the metal, a combination of a nitrogen atom and a carbon atom or a combination of a carbon atom, a nitrogen atom, an oxygen atom, and a sulfur atom is preferable, and specifically, a cyano group, a cyanuric group, or a sulfonic acid amide group is more preferable.

Preferred examples of a combination of the dipole-interactable groups (a combination of the functional group in the compound having a functional group and the group present in the surface of the metal) include a combination of identical dipole-interactable groups.

Examples thereof include an aspect in which, in a case where one is a cyano group, the other is a cyano group.

Examples thereof also include an aspect in which, in a case where one is a sulfonic acid amide group, the other is a sulfonic acid amide group.

—Curing Reactive Group—

Preferred examples of the compound having a curing reactive group include the following curable compound. In addition, in a case where the layer B contains a curable compound, it is preferable that the layer B contains the curable compound and a curing aid.

~Curable Compound~

The curable compound is a compound which is cured by irradiation with heat or light (for example, visible light, ultraviolet rays, near-infrared rays, far-infrared rays, electron beam, or the like), may require a curing aid described later. Examples of such a curable compound include an epoxy compound, a cyanate ester compound, a vinyl compound, a silicone compound, an oxazine compound, a maleimide compound, an allyl compound, an acrylic compound, a methacrylic compound, and a urethane compound. These may be used alone or in combination of two or more thereof. Among these, from the viewpoint of characteristics such as compatibility with the above-described polymer and heat resistance, at least one selected from the group consisting of an epoxy compound, a cyanate ester compound, a vinyl compound, a silicone compound, an oxazine compound, a maleimide compound, and an allyl compound is preferable; and at least one selected from the group consisting of an epoxy compound, a cyanate ester compound, a vinyl compound, an allyl compound, and a silicone compound is more preferable.

A content of the curable compound in the layer B is preferably 10% by mass or more and 90% by mass or less, and more preferably 20% by mass or more and 80% by mass or less with respect to the total mass of the layer B.

~Curing Aid~

Examples of the curing aid include polymerization initiators such as a photoreaction initiator (a photoradical generator, a photoacid generator, or a photobase generator). Specific examples of the curing aid include an onium salt compound, a sulfone compound, a sulfonate compound, a sulfonimide compound, a disulfonyldiazomethane compound, a disulfonylmethane compound, an oximesulfonate compound, a hydrazinesulfonate compound, a triazine compound, a nitrobenzyl compound, a benzylimidazole compound, organic halides, octylic acid metal salt, and disulfone. These curing aids may be used alone or in combination of two or more thereof, regardless of the type.

A content of the curing aid in the layer B is preferably 5% by mass or more and 20% by mass or less, and more preferably 5% by mass or more and 10% by mass or less with respect to the total mass of the layer B.

As the functional group in the compound having a functional group, specifically, it is preferable to have an epoxy group, an oxetanyl group, an isocyanate group, an acid anhydride group, a carbodiimide group, an N-hydroxy ester group, a glyoxal group, an imidoester group, a halogenated alkyl group, a thiol group, a hydroxy group, a carboxy group, an amino group, an amide group, an isocyanate group, an aldehyde group, a sulfuric acid group, a sulfonic acid group, an ammonium group, a pyridinium group, a phosphonium group, an oxonium group, a sulfonium group, a selenonium group, an iodonium group, a phosphoric acid group, a phosphonic acid group, a phosphinic acid group, a sulfonic acid group, or at least one selected from the group consisting of a sulfinic acid group or a carboxy group, a hydroxy group, a carboxy group, a primary amide group, a secondary amide group, a primary amino group, a secondary amino group, a primary sulfonamide group, a secondary sulfonamide group, an imide group, a urea bond, and a urethane bond. From the viewpoint of improving the adhesiveness, an epoxy group, an oxetanyl group, an isocyanate group, an acid anhydride group, a carbodiimide group, an N-hydroxy ester group, a glyoxal group, an imidoester group, a halogenated alkyl group, or a thiol group is more preferable.

Specific examples of the bonds or interaction between two kinds of the functional groups are described below, but the bonds or interaction in the present disclosure is not limited thereto.

Covalent bond

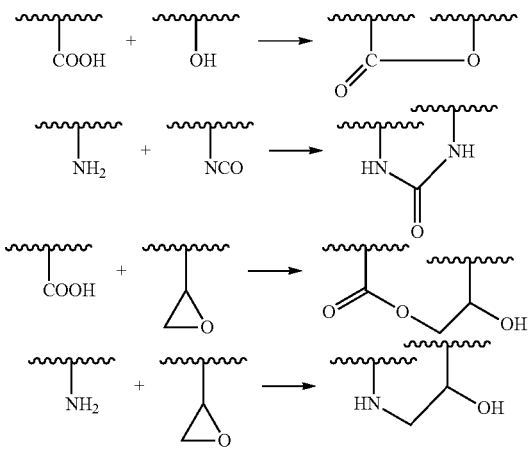

Ion bond

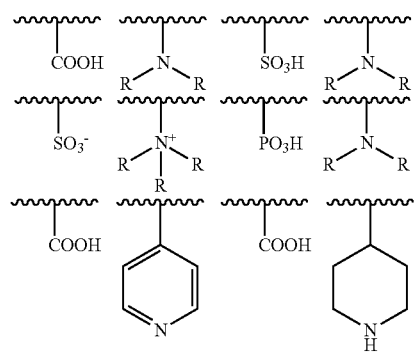

Hydrogen bond

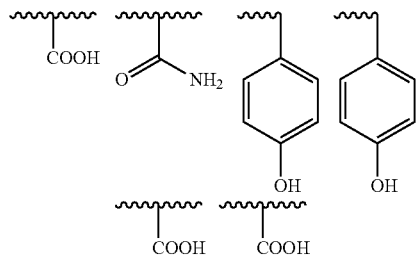

Dipole interaction

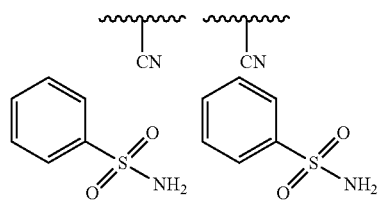

From the viewpoint of dielectric loss tangent of the polymer film and adhesiveness to a metal, the compound having a functional group is preferably a polyfunctional epoxy compound or a polymer of a polyfunctional epoxy compound, more preferably a bifunctional epoxy compound or a polymer of a bifunctional epoxy compound, and particularly preferably a bifunctional epoxy compound.

The layer B may contain only one or two or more kinds of the compounds having a functional group.

From the viewpoints of the dielectric loss tangent of the film and the adhesiveness to the metal, the content of the compound having a functional group in the layer B is preferably 0.1% by mass to 20% by mass and more preferably 1% by mass to 10% by mass with respect to the total mass of the layer B.

The layer B may contain an additive other than those described above.

Preferred aspects of other additives which are used in the layer B are the same as the preferred aspects of other additives which are used in the layer A, except as described below.

In addition, an average thickness of the layer B is not particularly limited, and from the viewpoints of the dielectric loss tangent of the film, the laser processing suitability, and the level difference followability, the average thickness is preferably 1 µm to 90 µm, more preferably 5 µm to 60 µm, and particularly preferably 10 µm to 30 µm.

The film according to the embodiment of the present disclosure includes the layer B, and thus, a film having excellent adhesiveness to the metal can be obtained. For example, in a case where the layer A has a filler, it is presumed that, by including the layer B and the layer A brittle due to the addition of the filler, the surface of the film is improved, and effects such as improvement in adhesiveness are obtained.

In addition, the layer B is preferably a surface layer (outermost layer). For example, in a case where the film is used as a laminate (laminated plate with a metal layer) having a layer configuration of metal layer/layer A/layer B, another metal layer or laminated plate with a metal layer may be further disposed on the layer B side. In this case, the interfacial fracture between the layer B and the metal layer different from the layer B in the laminate is suppressed, and the level difference followability is improved.

In addition, it is preferable that the polymer contained in the layer B contains a polymer having a higher breaking strength (toughness) that the polymer contained in the layer A.

The breaking strength is measured by the following method.

A sample including the polymer to be measured is produced, and using a universal tensile tester "STM T50BP" manufactured by Toyo Baldwin Co., Ltd., a stress against elongation is measured at a tensile rate of 10%/min in an atmosphere of 25° C. and 60% RH to obtain the breaking strength.

<Layer C>

The film according to the embodiment of the present disclosure preferably further has a layer C, and more preferably has the layer B, the layer A, and the layer C in this order from the viewpoint of level difference followability.

In addition, in a case where a metal layer is present separately from each of the above-described layers, the layer C is preferably a surface layer (outermost layer).

From the viewpoints of the dielectric loss tangent of the film and the level difference followability, the layer C preferably contains a polymer having a dielectric loss tangent of 0.01 or less.

The preferred aspect of the polymer having a dielectric loss tangent of 0.01 or less, which is used for the layer C, is the same as the preferred aspect of the polymer having a dielectric loss tangent of 0.01 or less, which is used for the layer A, except as described later.

The liquid crystal polymer, which is contained in the layer C, may be the same as or different from the polymer having a dielectric loss tangent is 0.01 or less, which contained in the layer A or the layer B, but from the viewpoint of the adhesiveness between the layer A and the layer C, the layer C preferably contains the same polymer as the polymer having a dielectric loss tangent is 0.01 or less, which is contained in the layer A.

From the viewpoint of adhesiveness to the metal, the content of the polymer having a dielectric loss tangent of 0.01 or less in the layer C is preferably equal to or less than the content of the polymer having a dielectric loss tangent of 0.01 or less in the layer A.

From the viewpoints of the dielectric loss tangent of the film and the level difference followability, the content of the polymer having a dielectric loss tangent of 0.01 or less in the layer C is preferably 10% by mass to 100% by mass, more preferably 20% by mass to 99% by mass, still more preferably 50% by mass to 98% by mass, and particularly preferably 70% by mass to 98% by mass with respect to the total mass of the layer C.

The layer C preferably contains a compound having a functional group.

Preferred aspects of the compound having a functional group, which is used in the layer C, are the same as the preferred aspects of the compound having a functional group, which is used in the layer B, except as described below.

The compound having a functional group, which is contained in the layer C, may be the same as or different from the compound having a functional group, which is contained in the layer B.

The layer C may contain only one or two or more kinds of the compounds having a functional group.

It is preferable that a content proportion of the compound having a functional group in the layer C is higher than a content proportion of the compound having a functional group in the layer A.

From the viewpoint of the dielectric loss tangent of the polymer film and the adhesiveness to the metal, the content of the compound having a functional group in the layer C is preferably 0.1% by mass to 20% by mass and more preferably 1% by mass to 10% by mass with respect to the total mass of the layer C.

The layer C may contain a filler.

Preferred aspects of the filler which is used in the layer C are the same as the preferred aspects of the filler which is used in the layer B, except as described below.

The content of the filler in the layer C is not particularly limited and can be arbitrarily set.

In a case where the metal layers are provided on both surfaces of the film, from the viewpoint of level difference followability, it is preferable to be less than the content of the filler in the layer A.

In addition, in the case where metal layers are provided on both surfaces of the film, from the viewpoint of level difference followability, it is preferable that the layer C does not contain the filler or the content of the filler in the layer C is more than 0% by volume and 20% by volume or less with respect to the total volume of the layer C; it is more preferable that the layer C does not contain the filler or the content of the filler in the layer C is more than 0% by volume and 10% by volume or less with respect to the total volume of the layer C; it is still more preferable that the layer C does not contain the filler or the content of the filler in the layer C is more than 0% by volume and 5% by volume or less with respect to the total volume of the layer C; and it is particularly preferable that the layer C does not contain the filler.

The content of the filler in the layer C is preferably 0% by mass to 15% by mass, and more preferably 0% by mass to 5% by mass with respect to the total mass of the layer C.

A content of a filler such as polyethylene and an olefin-based elastomer is, for example, preferably 50% by volume to 90% by volume, and more preferably 75% by volume to 85% by volume. In this case, the content of the filler in the layer C is preferably 55% by mass to 90% by mass, and more preferably 80% by mass to 85% by mass with respect to the total mass of the layer C.

The layer C may contain an additive other than those described above.

Preferred aspects of other additives which are used in the layer C are the same as the preferred aspects of other additives which are used in the layer A, except as described below.

From the viewpoint of dielectric loss tangent of the film and adhesiveness to the metal, it is preferable that an average thickness of the layer C is smaller than an average thickness of the layer A.

From the viewpoint of dielectric loss tangent of the film and level difference followability, a value of $T^A/T^C$, which is a ratio of the average thickness $T^A$ of the layer A to the average thickness $T^C$ of the layer C, is preferably more than 1, more preferably 2 to 100, still more preferably 2.5 to 20, and particularly preferably 3 to 15.

From the viewpoint of dielectric loss tangent of the film and level difference followability, a value of $T^B/T^C$, which is a ratio of the average thickness $T^B$ of the layer B to the average thickness $T^C$ of the layer C, is preferably more than 1, more preferably 2 to 100, still more preferably 2.5 to 20, and particularly preferably 3 to 10.

Further, from the viewpoint of the dielectric loss tangent of the film and the level difference followability, the average thickness of the layer C is preferably 0.1 µm to 20 µm, more preferably 0.5 µm to 15 µm, and particularly preferably 1 µm to 10 µm.

From the viewpoint of strength and electrical characteristics (characteristic impedance) in a case of being laminated with the metal layer, an average thickness of the film according to the embodiment of the present disclosure is preferably 6 µm to 200 µm, more preferably 12 µm to 100 µm, and particularly preferably 20 µm to 60 µm.

The average thickness of the film is measured at optional five sites using an adhesive film thickness meter, for example, an electronic micrometer (product name, "KG3001A", manufactured by Anritsu Corporation), and the average value of the measured values is defined as the average thickness of the film.

From the viewpoint of dielectric constant, the dielectric loss tangent of the film according to the embodiment of the present disclosure is preferably 0.008 or less, more preferably 0.005 or less, still more preferably 0.004 or less, and particularly preferably more than 0 and 0.003 or less.

<Method of Manufacturing Film>
[Film Formation]

A method of manufacturing the film according to the embodiment of the present disclosure is not particularly limited, and a known method can be referred to.

Suitable examples of the method of manufacturing the film according to the embodiment of the present disclosure include a co-casting method, a multilayer coating method, and a co-extrusion method. Among these, the co-casting method is particularly preferable for formation of a relatively thin film, and the co-extrusion method is particularly preferable for formation of a thick film.

In a case of being manufactured by the co-casting method and the multilayer coating method, it is preferable to perform the co-casting method or the multilayer coating method as a composition for forming a layer A, a composition for forming a layer B, a composition for forming a layer C, or the like, in which the components of each layer such as a polymer having a dielectric loss tangent of 0.01 or less are dissolved or dispersed in a solvent.

Examples of the solvent include halogenated hydrocarbons such as dichloromethane, chloroform, 1,1-dichloroethane, 1,2-dichloroethane, 1,1,2,2-tetrachloroethane, 1-chlorobutane, chlorobenzene, and o-dichlorobenzene; halogenated phenols such as p-chlorophenol, pentachlorophenol, and pentafluorophenol; ethers such as diethyl ether, tetrahydrofuran, and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amides such as N,N-dimethylformamide, N,N-dimethylacetamide, and N-methylpyrrolidone; urea compounds such as tetramethylurea; nitro compounds such as nitromethane and nitrobenzene; sulfur compounds such as dimethyl sulfoxide and sulfolane; and phosphorus compounds such as hexamethylphosphoramide and tri-n-butyl phosphate. Among these, two or more kinds thereof may be used in combination.

The solvent preferably contains an aprotic compound (particularly, an aprotic compound having no halogen atom) for low corrosiveness and easiness to handle. A proportion of the aprotic compound to the whole solvent is preferably 50% by mass to 100% by mass, more preferably 70% by mass to 100% by mass, and particularly preferably 90% by mass to 100% by mass. In addition, from the viewpoint of easily dissolving the liquid crystal polymer, as the above-described aprotic compound, it is preferable to contain an amide such as N,N-dimethylformamide, N,N-dimethylacetamide, tetramethylurea, and N-methylpyrrolidone, or an ester such as γ-butyrolactone; and it is more preferable to contain N,N-dimethylformamide, N,N-dimethylacetamide, or N-methylpyrrolidone.

In addition, as the solvent, it is preferable to contain a compound having a dipole moment of 3 to 5, because the above-described polymer such as the liquid crystal polymer can be easily dissolved. A proportion of the compound having a dipole moment of 3 to 5 to the whole solvent is preferably 50% by mass to 100% by mass, more preferably 70% by mass to 100% by mass, and particularly preferably 90% by mass to 100% by mass.

It is preferable to use the compound having a dipole moment of 3 to 5 as the above-described aprotic compound.

In addition, as the solvent, it is preferable to contain a compound having a boiling point of 220° C. or lower at 1 atm, because the solvent is easily removed. A proportion of the compound having a boiling point of 220° C. or lower at 1 atm to the whole solvent is preferably 50% by mass to 100% by mass, more preferably 70% by mass to 100% by mass, and particularly preferably 90% by mass to 100% by mass.

It is preferable to use the compound having a boiling point of 220° C. or lower at 1 atm as the above-described aprotic compound.

In addition, in a case where the film is manufactured by a manufacturing method such as the co-casting method, the multilayer coating method, the co-extrusion method, or the like described above, a support may be used in the method of manufacturing the film according to the embodiment of the present disclosure. In addition, in a case where the metal layer (metal foil) or the like used in the laminate described later is used as the support, the support may be used as it is without being peeled off.

Examples of the support include a metal drum, a metal band, a glass plate, a resin film, and a metal foil. Among these, a metal drum, a metal band, or a resin film is preferable.

Examples of the resin film include a polyimide (PI) film, and examples of commercially available products thereof include U-PILEX S and U-PILEX R (manufactured by Ube Corporation), KAPTON (manufactured by Du Pont-Toray Co., Ltd.), and IF30, IF70, and LV300 (manufactured by SKC Kolon PI, Inc.).

In addition, the support may have a surface treatment layer formed on the surface so that the support can be easily peeled off. Hard chrome plating, a fluororesin, or the like can be used as the surface treatment layer.

An average thickness of the support is not particularly limited, but is preferably 25 μm or more and 75 μm or less and more preferably 50 μm or more and 75 μm or less.

In addition, a method for removing at least a part of the solvent from a cast or applied film-like composition (a casting film or a coating film) is not particularly limited, and a known drying method can be used.

[Stretching]

In the film according to the embodiment of the present disclosure, stretching can be combined as appropriate from the viewpoint of controlling molecular alignment and adjusting linear expansion coefficient and mechanical properties. The stretching method is not particularly limited, and a known method can be referred to, and the stretching method may be carried out in a solvent-containing state or in a dry film state. The stretching in the solvent-containing state may be carried out by gripping and stretching the film, or may be carried out by utilizing self-contraction due to drying without stretching. The stretching is particularly effective for the purpose of improving the breaking elongation and the breaking strength, in a case where brittleness of the film is reduced by addition of an inorganic filler or the like.

In addition, the method of producing a film according to the embodiment of the present disclosure may include a step of polymerizing the film by light or heat, as necessary.

A light irradiation unit and a heat application unit are not particularly limited, and a known light irradiation unit such as a metal halide lamp and a known heat application unit such as a heater can be used.

Light irradiation conditions and heat application conditions are not particularly limited, and the polymerization can be carried out at a desired temperature and time and in a known atmosphere.

[Heat Treatment]

The method of producing a film according to the embodiment of the present disclosure preferably includes a step of subjecting the film to a heat treatment (annealing).

Specifically, from the viewpoint of dielectric loss tangent and peel strength, the heat treatment temperature in the above-described step of heat-treating is preferably 260° C. to 370° C., more preferably 280° C. to 360° C., and still more preferably 300° C. to 350° C. The heat treatment time is preferably 15 minutes to 10 hours and more preferably 30 minutes to 5 hours.

In addition, the method of manufacturing the film according to the embodiment of the present disclosure may include other known steps as necessary.

<Applications>

The film according to the embodiment of the present disclosure can be used for various applications. Among the various applications, the film can be used suitably as a film for an electronic component such as a printed wiring board and more suitably for a flexible printed circuit board.

In addition, the film according to the embodiment of the present disclosure can be suitably used as a metal adhesive film.

(Laminate)

The laminate according to the embodiment of the present disclosure may be a laminate in which the film according to the embodiment of the present disclosure is laminated, but is preferably a laminate having the film according to the embodiment of the present disclosure and a metal layer or a metal wire disposed on at least one surface of the film.

In addition, the laminate according to the embodiment of the present disclosure preferably has the layer A, the layer B, and the metal layer or the metal wire in this order, in which a ratio of an elastic modulus of the layer A at 160° C. to an elastic modulus of the layer B at 160° C. is 1.2 or more, and a thermal conductivity of the layer A is 0.05 W/(m·K) or more.

In addition, the laminate according to the embodiment of the present disclosure preferably has the film according to the embodiment of the present disclosure and a metal layer or a metal wire disposed on the surface of the film on the layer B side, and it is more preferable that the metal layer or the metal wire is a copper layer or a copper wire.

It is preferable that the metal layer or the metal wire disposed on the surface on the layer B side is a metal layer or a metal wire disposed on the surface of the layer B.

In addition, the laminate according to the embodiment of the present disclosure preferably has the film according to the embodiment of the present disclosure, which includes the layer B, the layer A, and the layer C in this order, and a metal layer or a metal wire disposed on a surface of the film on the layer B side and a metal layer or a metal wire disposed on a surface of the film on the layer C side, and it is more preferable that all of the metal layer or the metal wire is a copper layer or a copper wire.

The metal layer or the metal wire disposed on the surface on the layer C side is preferably a metal layer or a metal wire disposed on the surface of the layer C, the metal layer or the metal wire disposed on the surface on the layer B side is more preferably a metal layer or a metal wire disposed on the surface of the layer B, and the metal layer or the metal wire disposed on the surface on the layer C side is more preferably a metal layer or a metal wire disposed on the surface of the layer C.

In addition, the metal layer disposed on the surface of the above-described layer B side and the metal layer disposed on the surface of the above-described layer C side may be a metal layer having the same material, thickness, and shape, or may be metal layers having different materials, thicknesses, and shapes. From the viewpoint of adjusting the characteristic impedance, the metal layer disposed on the surface of the above-described layer B side and the metal layer disposed on the surface of the above-described layer C side may be metal layers having different materials or thicknesses, or a metal layer may be laminated on only one side of the layer B or the layer C.

Furthermore, from the viewpoint of adjusting the characteristic impedance, preferred examples thereof also include an aspect in which a metal layer is laminated on one side of the layer B or the layer C, and another film is laminated on the other side.

The above-described metal layer and metal wire are not particularly limited and may be any known metal layer or metal wire, but for example, a silver layer, a silver wire, a copper layer, or a copper wire is preferable, and a copper layer or a copper wire is more preferable.

In addition, the above-described metal layer and metal wire are preferably metal wire.

Furthermore, the metal in the above-described metal layer and metal wire is preferably silver or copper, and more preferably copper.

A method of attaching the film according to the embodiment of the present disclosure to the metal layer or the metal wire is not particularly limited, and a known laminating method can be used.

In a case where the above-described metal layer is the above-described copper layer, a peel strength between the above-described film and the above-described copper layer is preferably 0.5 kN/m or more, more preferably 0.7 kN/m or more, still more preferably 0.7 kN/m to 2.0 kN/m, and particularly preferably 0.9 kN/m to 1.5 kN/m.

In the present disclosure, the peeling strength between the film and the metal layer (for example, the copper layer) is measured by the following method.

A peeling test piece with a width of 1.0 cm is produced from the laminate of the film and the metal layer, the film is fixed to a flat plate with double-sided adhesive tape, and the strength (kN/m) in a case of peeling the film off from the metal layer at a rate of 50 mm/min is measured by the 180° method in conformity with JIS C 5016 (1994).

From the viewpoint of reducing transmission loss of high-frequency signal, a surface roughness Rz of the above-described metal layer on the side in contact with the above-described film is preferably less than 1 μm, more preferably 0.5 μm or less, and particularly preferably 0.3 μm or less.

Since it is preferable that the surface roughness Rz of the above-described metal layer is as small as possible, the lower limit value thereof is not particularly set, but may be, for example, 0 or more.

The "surface roughness Rz" in the present disclosure refers to a value expressed in micrometer, which is the total value of the maximum value of height of peak and the maximum value of depth of valley observed on a roughness curve over the reference length.

In the present disclosure, the surface roughness Rz of the metal layer (for example, the copper layer) is measured by the following method.

Using a noncontact surface/layer cross-sectional shape measurement system VertScan (manufactured by MITSUBISHI CHEMICAL SYSTEMS, Inc.), a square of 465.48 μm in length and 620.64 μm in width is measured to create a roughness curve on the surface of the measurement object (metal layer) and create an average line of the roughness curve. A portion corresponding to the reference length is extracted from the roughness curve. The surface roughness Rz of the measurement object is measured by obtaining the total value of the maximum value of height of peak (that is, height from the average line to summit) and the maximum value of depth of valley (that is, depth from the average line to valley bottom) observed in the extracted roughness curve.

The metal layer is preferably a silver layer or a copper layer, and more preferably a copper layer. As the copper layer, a rolled copper foil formed by a rolling method or an electrolytic copper foil formed by an electrolytic method is preferable.

An average thickness of the metal layer, preferably the copper layer, is not particularly limited, but is preferably 2 µm to 20 µm, more preferably 3 µm to 18 µm, and still more preferably 5 µm to 12 µm. The copper foil may be copper foil with a carrier formed on a support (carrier) so as to be peelable. As the carrier, a known carrier can be used. An average thickness of the carrier is not particularly limited, but is preferably 10 µm to 100 µm and more preferably 18 µm to 50 µm.

In addition, from the viewpoint of further exerting the effects of the present disclosure, the above-described metal layer preferably has a known surface treatment layer (for example, a chemical treatment layer) on the surface of the side in contact with the film to ensure adhesion to the resin. In addition, it is preferable that the above-described interactable group is a group corresponding to the functional group of the compound having a functional group, which is contained in the above-described film, such as an amino group and an epoxy group, and a hydroxy group and an epoxy group.

Examples of the interactable group include a group mentioned as the functional group in the above-described compound having a functional group.

Among these, from the viewpoint of adhesiveness and case of performing a treatment, a covalent-bondable group is preferable, an amino group or a hydroxy group is more preferable, and an amino group is particularly preferable.

The metal layer in the laminate according to the embodiment of the present disclosure may be a metal layer having a circuit pattern.

It is also preferable that the metal layer in the laminate according to the embodiment of the present disclosure is processed into, for example, a desired circuit pattern by etching to form a flexible printed circuit board. The etching method is not particularly limited, and a known etching method can be used.

<Manufacturing Method of Laminate>

A manufacturing method of a laminate according to the embodiment of the present disclosure preferably includes a step A of applying a composition A including a liquid crystal polymer, a filler having a thermal conductivity of 0.05 W/(m·K) or more, and a solvent to form a layer A, and a step B of applying a composition B including a liquid crystal polymer and a solvent to form a layer B on at least one surface of the layer A, and more preferably a ratio an elastic modulus of the layer A at 160° C. to an elastic modulus of the layer B at 160° C. in the obtained laminate is 1.2 or more. The manufacturing method of a laminate according to the embodiment of the present disclosure more preferably includes a step A of applying a composition A including a liquid crystal polymer, a filler having a thermal conductivity of 0.05 W/(m·K) or more, and a solvent to form a layer A on the support, and a step B of applying a composition B including a liquid crystal polymer and a solvent to form a layer B on at least one surface of the layer A, and the ratio of an elastic modulus of the layer A at 160° C. to an elastic modulus of the layer B at 160° C. in the obtained laminate is more preferably 1.2 or more.

In addition, in the manufacturing method of a laminate according to the embodiment of the present disclosure, it is preferable that the step A and the step B are performed at the same time, and it is more preferable that the step A and the step B are performed at the same time by a co-casting method or a multilayer coating method.

Further, the manufacturing method of a laminate according to the embodiment of the present disclosure is preferably used for manufacturing the laminate according to the embodiment of the present disclosure.

A known method can be used as the manufacturing method of a laminate according to the embodiment of the present disclosure, and the method of manufacturing the film described above and the method of attaching the film according to the embodiment of the present disclosure to a metal layer or a metal wire can be suitably used.

EXAMPLES

Hereinafter, the present disclosure will be described in more detail with reference to examples. The materials, the used amounts, the proportions, the treatment contents, the treatment procedures, and the like described in the following examples can be appropriately changed without departing from the gist of the present disclosure. Therefore, the scope of the present disclosure is not limited to the following specific examples.

In addition, in the present examples, unless otherwise specified, "%" and "part" mean "% by mass" and "part by mass" respectively.

<<Measurement Method>>

[Dielectric Loss Tangent]

A dielectric constant was measured by a resonance perturbation method at a frequency of 10 GHz. A 10 GHz cavity resonator (CP531 manufactured by Kanto Electronics Application & Development Inc.) was connected to a network analyzer ("E8363B" manufactured by Agilent Technology), a sample (width: 2 mm× length: 80 mm) was inserted into the cavity resonator, and the dielectric constant and dielectric loss tangent of the sample were measured based on a change in resonance frequency for 96 hours before and after the insertion in an environment of a temperature of 25° C. and a humidity of 60% RH. In a case where a metal layer was laminated on the polymer film, the metal layer was etched and the evaluation was performed using only the polymer film taken out.

[Elastic Modulus at 160° C.]

The film was cut in cross section with a microtome or the like, and the layer A or the layer B was specified from an image observed with an optical microscope. Next, the elastic modulus of the specified layer A or layer B was measured as an indentation elastic modulus using a nanoindentation method. The indentation elastic modulus was measured by using a microhardness tester (product name "DUH-W201", manufactured by Shimadzu Corporation) to apply a load at a loading rate of 0.28 mN/sec with a Vickers indenter at 160° C., holding a maximum load of 10 mN for 10 seconds, and then unloading at a loading rate of 0.28 mN/sec.

Production Example

<Polymer>
P-1: Liquid Crystal Polymer Produced by a Production Method Described Below
—Production of P-1—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 143° C. over 60 minutes while being stirred in a nitrogen gas stream and was refluxed at 143° C. for 1 hour.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (A1).

The liquid crystal polyester (A1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid polymerization, cooled, and crushed with a crusher, thereby obtaining powdery liquid crystal polyester (A2).

The liquid crystal polyester (A2) obtained above was heated from room temperature (23° C.) to 180° C. over 1 hour and 20 minutes in a nitrogen atmosphere, further heated from 180° C. to 240° C. over 5 hours, maintained at 240° C. for 5 hours to carry out solid polymerization, and cooled, thereby obtaining powdery liquid crystal polyester P-1.
P-2: Commercially Available Liquid Crystal Polymer (Vectra A950, Manufactured by Polyplastics Co., Ltd.)
<Additive>
—Filler—
    F-1: Silica particles having an average particle diameter of 0.5 μm (SC2050-MB, manufactured by Admatechs Co., Ltd.)
    F-2: Boron nitride particles having an average particle diameter of 2 μm (HP-P1, manufactured by Mizushima Ferroalloy Co., Ltd., thermal conductivity is 0.05 W/(m·K) or more)
    F-3: Liquid crystal polymer particles produced by the production method described below, and thermal conductivity is 0.05 W/(m·K) or more.
—Production of F-3—

1034.99 g (5.5 mol) of 2-hydroxy-6-naphthoic acid, 378.33 g (1.75 mol) of 2,6-naphthalenedicarboxylic acid, 83.07 g (0.5 mol) of terephthalic acid, 272.52 g (2.475 mol; 0.225 mol excess with respect to the total molar amount of 2,6-naphthalenedicarboxylic acid and terephthalic acid) of hydroquinone, 1226.87 g (12 mol) of acetic acid anhydride, and 0.17 g of 1-methylimidazole as a catalyst were added to a reactor provided with a stirrer, a torque meter, a nitrogen gas introduction pipe, a thermometer, and a reflux condenser. After the gas in the reactor was replaced with nitrogen gas, the mixture was heated from room temperature to 145° C. over 15 minutes while being stirred in a nitrogen gas stream and was refluxed at 145° C. for 1 hour.

Next, the mixture was heated from 145° C. to 310° C. over 3 hours 30 minutes while distilling off by-product acetic acid and unreacted acetic acid anhydride and maintained at 310° C. for 3 hours, and solid liquid crystal polyester (C1) was taken out and cooled to room temperature. A flow start temperature of the polyester (C1) was 265° C.
[Production of Liquid Crystal Polyester Particles F-3]

The liquid crystal polyester (C1) was pulverized using a jet mill (KJ-200 manufactured by Kurimoto Iron Works Co., Ltd.), thereby obtaining liquid crystal polyester particles F-3. An average particle diameter of the liquid crystal polyester particles was 9 μm.

F-4: Aluminum Nitride Powder (Average Particle Diameter: 1 μm, H Grade (Manufactured by Tokuyama Corporation), Thermal Conductivity: 0.05 W/(m·K) or More)
—Elastomer—
    E-1: carboxyl group-modified hydrogenated styrene-ethylene-butylene-styrene block copolymer (Tuftec M1913, manufactured by Asahi Kasei Corporation)
    E-2: Elastomer particles produced by production method described below The elastomer E-1 was pulverized using a jet mill (KJ-200 manufactured by Kurimoto Iron Works Co., Ltd.), thereby obtaining elastomer particles E-2. The average particle diameter of the elastomer particles E-2 was 5 μm.
—Compound Having Functional Group—
    M-1: Condensed polycyclic epoxy resin (jER YX8800, manufactured by Mitsubishi Chemical Corporation)
    M-2: Aminophenol type epoxy resin (jER 630LSD, manufactured by Mitsubishi Chemical Corporation)

Examples 1 to 10 and Comparative Examples 1 and 2

<Film Forming Method>

The methods described in Table 2 were selected from the following.
[Coating]
—Preparation of Polymer Solution—

The polymer shown in Table 1 and the additive shown in Table 1 were added to N-methylpyrrolidone, and the mixture was stirred at 140° C. for 4 hours in a nitrogen atmosphere, thereby obtaining a polymer solution. The polymer and the additive were added at the mass ratios shown in Table 1, and the concentration of solid contents was set so that the mass ratio of the polymer and N-methylpyrrolidone was 9:91.

Subsequently, first, the polymer solution was allowed to pass through a sintered fiber metal filter having a nominal pore diameter of 5 μm and allowed to pass through a sintered fiber metal filter having the same nominal pore diameter of 5 μm, thereby obtaining each polymer solution for the layer A and the layer C.

In a case where the additive was not dissolved in N-methylpyrrolidone, a liquid crystal polymer solution was prepared without adding the additive, the mixture was allowed to pass through the above-described sintered fiber metal filter, and then the additive was added thereto and stirred.
—Production of Film—

The obtained polymer solutions for the layer A and the layer C were fed to a slot die coater equipped with a slide coater, and a copper foil (manufactured by Fukuda Metal Foil & Powder Co., Ltd., CF-T9DA-SV-18, thickness of 18 μm, surface roughness Rz of a bonding surface (treated surface): 0.85 μm) was coated so as to have a film having a two-layer structure (layer A/layer C) on a treated surface. The coating film was dried at 40° C. for 4 hours to remove the solvent from the coating film. Thereafter, the temperature was raised from room temperature to 300° C. at 1° C./min under a nitrogen atmosphere, and a heat treatment was performed at the temperature for 2 hours to obtain a polymer film (laminate) having a copper layer.

In the sample using the polymer P-3, a film (laminate) having a copper layer was obtained by applying the polyimide precursor solution to the above-described copper foil and then performing a heat treatment under conditions of 200° C. for 30 minutes, 300° C. for 20 minutes, and 360° C. for 5 minutes.

[Multilayer Coating]
—Preparation of Polymer Solution—

The polymer shown in Table 1 and the additive shown in Table 1 were added to N-methylpyrrolidone, and the mixture was stirred at 140° C. for 4 hours in a nitrogen atmosphere, thereby obtaining a polymer solution. The above-described polymer and additive were added in the volume ratios shown in Table 1, and the concentration of solid contents was set to the values shown in Table 1.

Subsequently, first, the polymer solution was allowed to pass through a sintered fiber metal filter having a nominal pore diameter of 5 µm and allowed to pass through a sintered fiber metal filter having the same nominal pore diameter of 5 µm, thereby obtaining polymer solution for the layer A, the layer B, and the layer C.

In a case where the additive was not dissolved in N-methylpyrrolidone, a liquid crystal polymer solution was prepared without adding the additive, the mixture was allowed to pass through the above-described sintered fiber metal filter, and then the additive was added thereto and stirred.
—Production of Film—

The obtained polymer solution for the layer A, the layer B, and the layer C were fed to a slot die coater equipped with a slide coater, and applied onto a treated surface of a copper foil (manufactured by Fukuda Metal Foil & Powder Co., Ltd., CF-T9DA-SV-18, thickness: 18 µm, surface roughness Rz of a surface to be attached (treated surface): 0.85 µm) such that a film having a three-layer configuration (layer B/layer A/layer B) was formed. The coating film was dried at 40° C. for 4 hours to remove the solvent from the coating film. Thereafter, the temperature was raised from room temperature to 300° C. at 1° C./min under a nitrogen atmosphere, and a heat treatment was performed at the temperature for 2 hours to obtain a polymer film (laminate) having a copper layer.

[Extrusion (Melt Film Formation)]
—Production of Resin Pellets—

Powder of the above-described polymer and the additive were mixed with each other, and the mixture was pelletized in a nitrogen atmosphere using a biaxial extruder. The obtained pellets for the layer A and pellets for the layer B were dried with dry air at 80° C. and used.
—Production of Film—

The obtained pellets were supplied into a cylinder through the same supply port of the biaxial extruder having a screw diameter of 50 mm, and heated and kneaded at 340° C. to 350° C. to obtain a kneaded material. Subsequently, the kneaded material for the layer A and the kneaded material for the layer B were respectively fed to a T-die having a multi-manifold structure, and a film-like kneaded material in a molten state was discharged and solidified on a chill roll. The obtained film was stripped from the chill roll, and stretched by tenter to adjust anisotropy (MD/TD) of elastic modulus to 2 or less, thereby obtaining a film.

[Transfer]

The materials of the layer B shown in Table 1 were stirred in toluene, thereby obtaining a surface varnish (resin composition). The obtained resin composition was applied to a release surface side of a PET film having a thickness of 38 µm and subjected to a one-side release treatment, and dried to a semi-cured state to obtain a transfer film of the layer B.

Subsequently, the transfer film of the layer B was disposed to face the layer A side of the film (laminate) having the copper layer described in Table 1 and Table 2 as an adherend, and the laminate was laminated, and then the release PET film was peeled off.

Further, the surface on the treated surface side of the copper foil (manufactured by Fukuda Metal Foil & Powder Co., Ltd., CF-T9DA-SV-18, thickness: 18 µm, surface roughness Rz of the bonding surface (treated surface): 0.85 µm) was bonded to the layer B, and the laminate was heated and pressurized under the conditions of 160° C. and 4 MPa for 60 minutes to obtain a film (laminate) having a copper layer on both surfaces.

[Preparation of Metal-Clad Laminated Plate]

As necessary, a copper layer was laminated on a surface of the polymer film not provided with a metal foil, among the above-described polymer films, by the following procedure.
—Copper-Clad Laminated Plate Precursor Step—

A copper foil (manufactured by Fukuda Metal Foil & Powder Co., Ltd., CF-T9DA-SV-18, thickness: 18 µm, surface roughness Rz of a bonding surface (treated surface): 0.85 µm) was placed in contact with a surface of the polymer film on which the copper layer was not formed, and a laminating treatment was performed using a laminator ("Vacuum Laminator V-130" manufactured by Nikko-Materials Co., Ltd.) under conditions of 140° C. and a laminating pressure of 0.4 MPa for 1 minute to obtain a copper-clad laminated plate precursor. In Comparative Example 2, a copper foil (manufactured by Fukuda Metal Foil & Powder Co., Ltd., CF-T4X-SV-18, thickness: 18 µm) was used instead of the copper foil (manufactured by Fukuda Metal Foil & Powder Co., Ltd., CF-T9DA-SV-18, thickness: 18 µm).
—Main Thermocompression Step—

Using a thermal compression machine ("MP-SNL" manufactured by Toyo Seiki Seisaku-sho, Ltd.), the obtained copper-clad laminated plate precursor was thermocompression-bonded for 10 minutes under conditions of 300° C. and 4.5 MPa to produce a single-sided copper-clad laminated plate or a double-sided copper-clad laminated plate.

<Production of Flexible Wiring Board>

Using the above-described metal-clad laminated plate, a flexible wiring board having a four-layer strip line structure of an outer layer plane (ground layer) was produced.
—Step of Forming Wiring Base Material—

The copper foil of the above-described double-sided copper-clad laminated plate was patterned by a known photofabrication method to produce a wiring base material including three pairs of signal lines. A length of the signal line was 100 mm, and a width of the signal line was set such that characteristic impedance was 50Ω.
—Lamination Step—

Using the above-described wiring base material and a pair of the above-described single-sided copper-clad laminated plates, a laminate of single-sided copper-clad laminated plate/wiring base material/single-sided copper-clad laminated plate was formed such that the wiring base material was in contact with the film side of the single-sided copper-clad laminated plate. Using a vacuum press device, the metal wires were laminated at a press temperature of 160° C. to produce a flexible wiring board.

Evaluation regarding distortion of wiring line was performed using the produced flexible wiring board. The evaluation methods were as follows. The evaluation results are shown in Table 2.

<Level Difference Followability (Wire Distortion)>

The flexible wiring board was cut with a microtome, the cross section was observed with an optical microscope, and the distortion of the wiring line was evaluated based on the following evaluation standard.

A: No distortion was recognized in the signal lines and the ground line.
B: While no distortion was recognized in the signal lines, distortion was recognized in the ground line.
C: Distortion was recognized in a pair of signal lines.
D: Distortion was recognized in two pairs or three pairs of signal lines.

<Laser Processing Suitability>

A through-hole via was processed from the layer C side of a copper-clad laminated plate having a copper layer on both surfaces using a UV-YAG laser Model 5330 manufactured by ESI. The cutting of the via portion was carried out with a microtome, and the cross section was observed with an optical microscope, and the length of the peeling of the layer A and the layer B (that is, the maximum length of the recess formed in the cross section of the cut portion in a horizontal direction). As the length of the peeling is shorter, laser processing suitability is better. In addition, Table 2 shows the longer one of the lengths of the peeling of the layer A and the layer B.

<<Evaluation>>

Each of the produced polymer films was evaluated by the measurement methods described above, and the evaluation results are shown in Table 2.

TABLE 2

| | | Ratio of elastic modulus at 160° C. | Dielectric loss tangent of film | Level difference follow-ability | Laser processing suitability (μm) |
|---|---|---|---|---|---|
| | Film forming method | | | | |
| Example 1 | Coating + transfer | 733 | 0.002 | A | 5 |
| Example 2 | Coating + transfer | 733 | 0.003 | A | 5 |
| Example 3 | Coating + transfer | 460 | 0.004 | A | 7 |
| Example 4 | Extraction + transfer | 460 | 0.004 | A | 7 |
| Example 5 | Coating + transfer | 410 | 0.004 | A | 9 |
| Example 6 | Coating + transfer | 383 | 0.004 | A | 11 |
| Example 7 | Multilayer coating | 905 | 0.002 | A | 5 |
| Example 8 | Multilayer coating | 442 | 0.002 | B | 5 |
| Example 9 | Coating + transfer | 633 | 0.002 | A | 5 |
| Example 10 | Coating + transfer | 467 | 0.002 | A | 8 |

TABLE 1

| | Layer B (surface layer) | | | | | | | | | Layer A (core layer) | | | |
|---|---|---|---|---|---|---|---|---|---|---|---|---|---|
| | Polymer | | Additive 1 | | Additive 2 | | Additive 3 | | Elastic modulus at 160° C. (MPa) | Thickness (μm) | Polymer | | Additive 1 | |
| | Type | Amount (part by mass) | Type | Amount (part by mass) | Type | Amount (part by mass) | Type | Amount (part by mass) | | | Type | Amount (part by mass) | Type | Amount (part by mass) |
| Example 1 | — | — | M-1 | 4 | E-1 | 64 | F-1 | 32 | 3.0 | 20 | P-1 | 20 | F-2 | 60 |
| Example 2 | — | — | M-1 | 4 | E-1 | 64 | F-1 | 32 | 3.0 | 20 | P-1 | 40 | F-2 | 60 |
| Example 3 | — | — | M-1 | 4 | E-1 | 64 | F-1 | 32 | 3.0 | 20 | P-1 | 75 | F-2 | 25 |
| Example 4 | — | — | M-1 | 4 | E-1 | 64 | F-1 | 32 | 3.0 | 20 | P-2 | 75 | F-2 | 25 |
| Example 5 | — | — | M-1 | 4 | E-1 | 64 | F-1 | 32 | 3.0 | 20 | P-1 | 85 | F-2 | 15 |
| Example 6 | — | — | M-1 | 4 | E-1 | 64 | F-1 | 32 | 3.0 | 20 | P-1 | 90 | F-2 | 10 |
| Example 7 | P-1 | 20 | — | — | E-2 | 80 | — | — | 2.1 | 20 | P-1 | 20 | F-2 | 60 |
| Example 8 | P-1 | 40 | — | — | E-2 | 60 | — | — | 4.3 | 20 | P-1 | 20 | F-2 | 60 |
| Example 9 | — | — | M-1 | 4 | E-1 | 64 | F-1 | 32 | 3.0 | 26 | P-1 | 20 | F-2 | 60 |
| Example 10 | — | — | M-1 | 4 | E-1 | 64 | F-1 | 32 | 3.0 | 20 | P-1 | 20 | F-2 | 30 |
| Comparative Example 1 | — | — | M-1 | 4 | E-1 | 64 | F-1 | 32 | 3.0 | 20 | P-1 | 20 | — | — |
| Comparative Example 2 | — | — | — | — | — | — | — | — | — | — | P-1 | 100 | — | — |

| | Layer A (core layer) | | | | | Layer C (copper foil side) | | | | |
|---|---|---|---|---|---|---|---|---|---|---|
| | Additive 2 | | Elastic modulus at 160° C. (MPa) | Thermal conductivity (W/(m·K)) | Thickness (μm) | Polymer | | Additive 1 | | Thickness (μm) |
| | Type | Amount (part by mass) | | | | Type | Amount (part by mass) | Type | Amount (part by mass) | |
| Example 1 | F-4 | 20 | 2200 | 2.40 | 27 | P-1 | 95 | M-2 | 5 | 3 |
| Example 2 | — | — | 2200 | 2.50 | 27 | P-1 | 95 | M-2 | 5 | 3 |
| Example 3 | — | — | 1380 | 1.20 | 27 | P-1 | 95 | M-2 | 5 | 3 |
| Example 4 | — | — | 1380 | 1.20 | 27 | P-1 | 95 | M-2 | 5 | 3 |
| Example 5 | — | — | 1230 | 0.80 | 27 | P-1 | 95 | M-2 | 5 | 3 |
| Example 6 | — | — | 1150 | 0.60 | 27 | P-1 | 95 | M-2 | 5 | 3 |
| Example 7 | F-3 | 20 | 1900 | 0.18 | 27 | P-1 | 95 | M-2 | 5 | 3 |
| Example 8 | F-3 | 20 | 1900 | 0.18 | 27 | P-1 | 95 | M-2 | 5 | 3 |
| Example 9 | F-3 | 20 | 1900 | 0.18 | 27 | P-1 | 95 | M-2 | 5 | 3 |
| Example 10 | F-3 | 50 | 1400 | 0.14 | 27 | P-1 | 95 | M-2 | 5 | 3 |
| Comparative Example 1 | F-3 | 80 | 730 | 0.04 | 30 | P-1 | 95 | M-2 | 5 | 3 |
| Comparative Example 2 | — | — | 1000 | 0.19 | 50 | — | — | — | — | — |

TABLE 2-continued

|  | Film forming method | Ratio of elastic modulus at 160° C. | Dielectric loss tangent of film | Level difference followability | Laser processing suitability (μm) |
|---|---|---|---|---|---|
| Comparative Example 1 | Coating + transfer | 243 | 0.002 | A | 15 |
| Comparative Example 2 | Coating | — | 0.005 | D | 5 |

From the results shown in Tables 1 and 2, it was found that the films of Examples 1 to 10, which are films according to the embodiment of the present disclosure, are more excellent in level difference followability and laser processing suitability than the films of Comparative Examples 1 and 2.

In addition, from the results shown in Table 1 and Table 2, the films of Examples 1 to 10, which are the films according to the embodiment of the present disclosure, have a low dielectric loss tangent.

The disclosure of JP2022-060849 filed on Mar. 31, 2022 is incorporated herein by reference in its entirety.

All publications, patent applications, and technical standards described in the present specification are herein incorporated by reference to the same extent as in a case where each publication, each patent application, and each technical standard are specifically and individually indicated to be incorporated by reference.

What is claimed is:

1. A film comprising:
a layer A; and
a layer B provided on at least one surface of the layer A,
wherein a ratio of an elastic modulus of the layer A at 160° C. to an elastic modulus of the layer B at 160° C. is 1.2 or more,
a thermal conductivity of the layer A is 0.05 W/(m·K) or more, and
a dielectric loss tangent of the layer A is 0.01 or less.

2. The film according to claim 1,
wherein an elastic modulus of the layer A at 160° C. is 100 MPa to 2,500 MPa.

3. The film according to claim 1,
wherein the layer A contains a liquid crystal polymer.

4. The film according to claim 1,
wherein the layer A contains aromatic polyester amide.

5. The film according to claim 1,
wherein the layer A contains a filler having a thermal conductivity of 0.05 W/(m·K) or more.

6. The film according to claim 1,
wherein a dielectric loss tangent of the layer B is 0.01 or less.

7. The film according to claim 1,
wherein the layer B contains a liquid crystal polymer.

8. The film according to claim 1,
wherein the layer B contains aromatic polyester amide.

9. The film according to claim 1,
wherein the layer B contains a thermoplastic resin having a constitutional unit having an aromatic hydrocarbon group.

10. A laminate comprising:
the film according to claim 1; and
a metal layer or a metal wire disposed on at least one surface of the film.

11. A laminate comprising, in the following order:
a layer A;
a layer B; and
a metal layer or a metal wire,
wherein a ratio of an elastic modulus of the layer A at 160° C. to an elastic modulus of the layer B at 160° C. is 1.2 or more,
a thermal conductivity of the layer A is 0.05 W/(m·K) or more, and
a dielectric loss tangent of the layer A is 0.01 or less.

12. A manufacturing method of a laminate comprising:
a step A of applying a composition A containing a liquid crystal polymer, a filler having a thermal conductivity of 0.05 W/(m·K) or more, and a solvent to form a layer A; and
a step B of applying a composition B containing a liquid crystal polymer and a solvent to form a layer B on at least one surface of the layer A.

13. The manufacturing method of a laminate according to claim 12,
wherein the step A and the step B are performed at the same time.

* * * * *